United States Patent
Shima

(10) Patent No.: US 6,822,727 B2
(45) Date of Patent: Nov. 23, 2004

(54) EXPOSURE APPARATUS, METHOD OF MANUFACTURING SEMICONDUCTOR DEVICES, SEMICONDUCTOR MANUFACTURING PLANT, METHOD OF MAINTAINING EXPOSURE APPARATUS, AND POSITION DETECTOR

(75) Inventor: Shinichi Shima, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/986,958

(22) Filed: Nov. 13, 2001

(65) Prior Publication Data

US 2002/0057424 A1 May 16, 2002

(30) Foreign Application Priority Data

Nov. 14, 2000 (JP) .......................... 2000-346301
Nov. 5, 2001 (JP) .......................... 2001-339865

(51) Int. Cl.$^7$ .......................... G03B 27/42; G03B 27/52
(52) U.S. Cl. .......................... 355/53; 355/30
(58) Field of Search .......................... 355/52, 53, 55, 355/67–71, 30; 250/548; 356/399–401

(56) References Cited

U.S. PATENT DOCUMENTS

| | | | | |
|---|---|---|---|---|
| 5,243,377 A | * | 9/1993 | Umatate et al. | 355/53 |
| 5,474,641 A | * | 12/1995 | Otsuki et al. | 156/345 |
| 5,559,584 A | * | 9/1996 | Miyaji et al. | 355/53 |
| 5,689,377 A | | 11/1997 | Takahashi | 359/727 |
| 5,825,470 A | * | 10/1998 | Miyai et al. | 355/72 |
| 5,859,707 A | | 1/1999 | Nakagawa et al. | 356/401 |
| 5,971,577 A | | 10/1999 | Mori et al. | 362/575 |
| 6,280,062 B1 | | 8/2001 | Mori et al. | 362/308 |
| 6,312,859 B1 | * | 11/2001 | Taniguchi | 430/22 |
| 6,320,646 B1 | * | 11/2001 | Mouri | 355/53 |
| 6,377,338 B1 | * | 4/2002 | Suenaga | 355/67 |
| 6,406,820 B1 | * | 6/2002 | Ota | 430/30 |
| 6,414,743 B1 | * | 7/2002 | Nishi et al. | 355/69 |
| 6,485,153 B2 | * | 11/2002 | Ota | 359/859 |
| 6,545,746 B1 | * | 4/2003 | Nishi | 355/53 |
| 2002/0126269 A1 | * | 9/2002 | Sato | 355/77 |

FOREIGN PATENT DOCUMENTS

| | | |
|---|---|---|
| EP | 1 069 448 | 1/2001 |
| JP | 4-352608 | 12/1992 |
| JP | 8-334695 | 12/1996 |
| JP | 9-219354 | 8/1997 |
| JP | 11-219900 | 8/1999 |
| JP | 11-345761 | 12/1999 |
| JP | 2000-91219 | 3/2000 |
| JP | 2000-195772 | 7/2000 |
| JP | 2001-15405 | 1/2001 |
| JP | 2001-27727 | 1/2001 |
| WO | 99/26278 | 11/1998 |
| WO | 99/52004 | 10/1999 |

* cited by examiner

*Primary Examiner*—Henry Hung Nguyen
(74) *Attorney, Agent, or Firm*—Fitzpatrick, Cella, Harper & Scinto

(57) ABSTRACT

An exposure apparatus includes a projection optical system for projecting a pattern, which has been formed on a reticle, onto a photosensitive substrate, wherein a projection region of the pattern, which region is formed on the substrate via the projection optical system, is formed at a position that is off-centered with respect to an optical axis of the projection optical system, a substrate stage capable of holding and moving the substrate, a substrate transport system for transporting the substrate to the substrate stage, wherein the substrate transport system is disposed on the side of the projection region with respect to the optical axis, and the substrate transport system and the substrate stage are arranged in a divided space which is purged with inert gas, and a position detection system for detecting an alignment mark on the substrate.

7 Claims, 15 Drawing Sheets

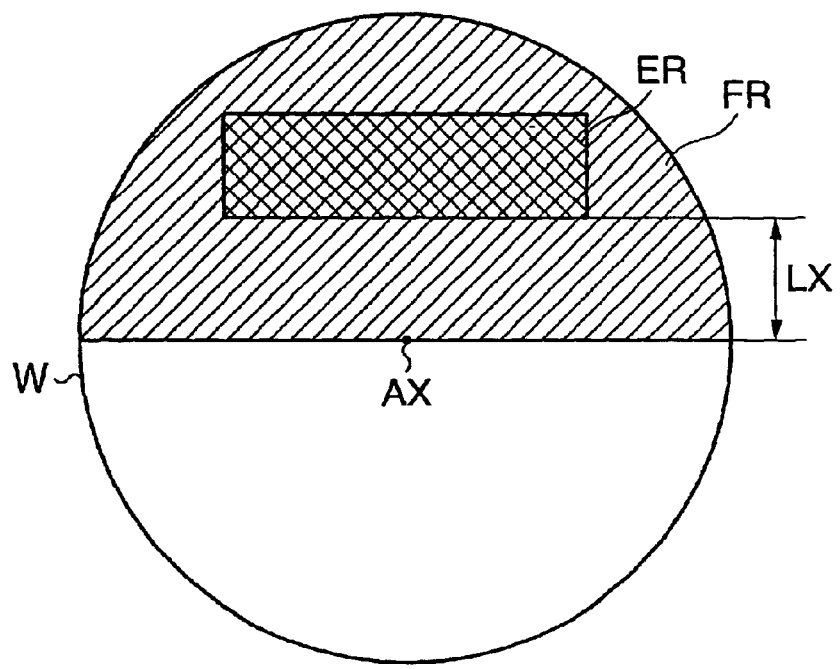
F I G. 3

FIG. 13

| URL | http://www.maintain.co.jp/db/input.html |

MALFUNCTION DATABASE INPUT SCREEN

DATE OF OCCURRENCE [2000/3/15] ~404
MODEL [*********] ~401
SUBJECT MATTER [OPERATING MALFUNCTION (ERROR AT BOOTING)] ~403
EQUIPMENT SERIAL NO. [465NS4580001] ~402
DEGREE OF URGENCY [D] ~405
CONDITION [LED CONTINUES FLASHING AFTER POWER IS TURNED ON] ~406
COUNTERMEASURE METHOD [POWER TURNED ON AGAIN (RED BUTTON PUSHED AT START UP)] ~407
PROGRESS REPORT [TEMPORARY MEASURES COMPLETED] ~408

[SEND] [RESET]    410              411                 412
LINK TO DATABASE OF RESULTS   SOFTWARE LIBRARY   OPERATION GUIDE

FLOW OF SEMICONDUCTOR DEVICE MANUFACTURE

EXPOSURE APPARATUS, METHOD OF MANUFACTURING SEMICONDUCTOR DEVICES, SEMICONDUCTOR MANUFACTURING PLANT, METHOD OF MAINTAINING EXPOSURE APPARATUS, AND POSITION DETECTOR

FIELD OF THE INVENTION

This invention relates to an exposure apparatus and, more particularly, to an exposure apparatus used when a semiconductor device or the like is manufactured in a photolithography process.

BACKGROUND OF THE INVENTION

A demagnifying projection exposure apparatus is used widely in the fabrication of semiconductor circuits such as LSI chips. A demagnifying projection exposure apparatus forms a reduced image of a mask pattern on a wafer, which serves as a photosensitive substrate, via projection optics. The patterns of integrated circuits projected upon a semiconductor substrate to expose the same have become increasingly finer in recent years, and there is growing demand for a projection exposure apparatus having higher resolution and alignment precision.

Improved performance of equipment peripheral to the exposure apparatus is sought in order to achieve a reduction in pattern line width. Since this results in higher equipment cost, an important challenge is to reduce the initial cost and running cost of production facilities.

In order to raise the resolution of a projection exposure apparatus, it is necessary to enlarge the numerical aperture (NA) of the projection optics and to shorten the exposure wavelength thereof. However, making the NA of the projection optics greater than a certain value is difficult in terms of the structure of the optical system. Further, when the NA of the projection optics is enlarged, the utilizable focal depth decreases and, as a result, it is difficult to realize a resolution that is possible in theory. For this reason, it is especially required that the wavelength of the exposing light be reduced in order to raise the resolution of the projection exposure apparatus.

A KrF excimer laser having a wavelength of 248 nm and an ArF excimer laser having a wavelength of 193 nm have been proposed and put into practice as exposure light sources. There is also demand for a light source having a shorter wavelength on the order of 180 nm or less, especially an $F_2$ laser of wavelength 157.6 nm. When the wavelength of exposing light is reduced, however, absorption of the light by the optical components increases and hence, there is a limitation upon the types of glass materials that can be used as the optical components. For example, $CaF_2$ crystal (fluorite) alone is known as a practical refraction optical material that can be used for dealing with short-wavelength light. As a consequence, it is difficult to fabricate an optical system in which various types of aberration are limited to desired values through use solely of a refraction optical system employed heretofore in projection optics.

Further, a laser light source of wavelength 200 nm or less has a certain width even if the region of oscillation wavelength is narrowed. In order to maintain good contrast and project a mask pattern, therefore, it is required that chromatic aberration be reduced to the pm (picometer) order.

A reflection optical system utilizing a concave reflecting mirror generally is used as an optical system that reduces chromatic aberration. Further, a reflection and refraction-type optical system comprising a combination of a reflection optical system and a refraction optical system is capable of reducing various aberration inclusive, especially of chromatic aberration, without inviting an increase in the number of lenses. A demagnifying projection optical system of reflection-diffraction type has, therefore, been proposed in order to eliminate chromatic aberration produced by the range of wavelengths possessed by laser light.

[Projection Optics of Reflection-refraction-type Optical System]

A projection optical system of the type disclosed in the specification of Japanese Patent Application Laid-Open No. 8-334695, for example, is a so-called off-axis optical system in which an area offset from the optical axis is used as the optical path, the off-axis arrangement affords better image quality because there is less of a decline in quality of light and no shielding of image-forming light flux. It is also easier to fabricate the various optical members.

A similar example is a projection optical system disclosed in the specification of Japanese Patent Application Laid-Open No. 2000-195772. This optical system position a concave reflecting lens in such a manner that chromatic aberration can be corrected for in excellent fashion.

Furthermore, the specification of Japanese Patent Application Laid-Open No. 2001-27727 describes a reflection-refraction-type optical system as a projection optical system using reflection-refraction-type optics. This proposed optical system has a first image-formation optical system of reflection-refraction-type for forming an intermediate image of a first surface, and a second image-formation optical system of refraction type for forming the final image of the first surface on a second surface, telecentrically based upon light from the intermediate image. This is an optical system referred to generally as a single-barrel system. Since this projection optical system has the construction of a reflection-refraction-type optical system, the projection area of a mask pattern formed on the wafer is formed at a position off-center with respect to the center of the projection optics. Physically speaking, the center of the projection optics is the center of the optical components used in the refraction optics or the center of the optical axis of the optical system. It is the optical axis AX indicated in the specification of Japanese Patent Application Laid-Open No. 2001-27727. Further, since an intermediate image resides in the projection optics and the number of times of the reflection is an even number, the visual-field area on the side of the mask also is formed at a position that is off-center on the same side as the pattern projection area mentioned above.

Furthermore, the specification of Japanese Patent Application Laid-Open No. 2001-15405 describes a reflection-refraction-type optical system, which is referred to as a twin-barrel system, as another example of a projection optical system that relies upon reflection-refraction-type optics. This system has the usually disposed projection-optics lens barrel and an additional lens barrel of the same size placed alongside. Both lens barrels are connected by yet another lens barrel. In comparison with the disclosure of Japanese Patent Application Laid-Open No. 2001-27727, therefore, the apparatus is larger in size.

[Improvement in Alignment Precision]

With regard to achieving an improvement alignment precision, the following schemes are available for dealing with the alignment of the wafer and reticle in an exposure apparatus:

1. a TTL scheme for measuring the position of an alignment mark on the wafer via the projection optics;

2. an off-axis scheme for measuring the position of an alignment mark on the wafer directly without the intervention of the projection optics; and
3. a TTR scheme for observing the wafer and the reticle via the projection optics and detecting the relative positional relationship between the two.

An example of the TTL scheme is a method of detecting an alignment mark on the wafer using light having an alignment wavelength of non-exposing light via a projection optical system referred to as TTL-AA (Though The Lens Auto Alignment). The TTL-AA scheme is advantageous for the following reason: The amount by which the wafer stage is driven at the time of alignment measurement and at the time of exposure is small because the length of line (a so-called baseline) connecting the optical axis of the projection optics and the TTL-AA optical axis is made very short. This makes it possible to suppress measurement error that occurs owing to a change in the distance between the optical axis of the projection optics and the optical axis of the TTL-AA system caused by a change in the environment surrounding the wafer stage. In other words, the advantage is small fluctuation of the baseline.

However, when the exposing light is made short-wavelength light of which the light source is an ArF or $F_2$ laser, the glass material that can be used is limited. Consequently, correction for chromatic aberration with respect to the alignment wavelength of the projection optics is difficult. Accordingly, an off-axis scheme [referred to as "Off-axis Auto-alignment (OA) detection scheme" below] that is not susceptible to the effects of chromatic aberration in the projection optical system is important.

In OA detection, a projection optical system does not intervene. This is advantageous in that a light source of any wavelength or a light source having a broad wavelength region can be used. One example of an advantage of using a light source having a broad wavelength region is that the effects of thin-film interference can be removed from resist with which the wafer is coated. Accordingly, it can be said that the OA detection scheme, which is capable of correcting for aberration, is an important alignment scheme with regard to light having a broad wavelength region.

In a case where alignment of the reticle and wafer is carried out using the OA detection scheme in which the relationship between an examined position and an actual exposure position is invisible, a so-called baseline quantity is obtained in advance. This is the spacing between the center of measurement of the alignment detection system and the center of the projected image of the pattern on the reticle (the center of exposure). The amount of offset from the measurement center of the alignment mark on the wafer is detected by an alignment system of the OA detection system and the wafer is moved a distance obtained by correcting the amount of offset by the baseline amount, whereby the center of the shot area is positioned accurately at the center of exposure. In the process of using the exposure apparatus, however, there are instances where the baseline quantity fluctuates gradually owing to aging. If such a change in baseline occurs, the alignment precision (overlay precision) declines. Accordingly, it is necessary to perform periodically a baseline check to accurately measure the spacing between the center of measurement of the alignment sensor and the center of exposure.

FIG. 5 is a diagram schematically illustrating the principle of baseline measurement of a projection exposure apparatus. As shown in FIG. 5, a reticle R is provided with marks RMa and RMb at positions symmetrical with respect to a center C. The reticle R is held on a reticle stage 6, which is moved in such a manner that the center C of the reticle R will coincide with the optical axis AX of projection optics 7. A wafer stage 10 is provided with a reference member FP at a position that will not interfere with a photosensitive substrate 8. The reference member FP has a reference mark FM equivalent to an alignment mark formed on the surface of the photosensitive substrate 8. If the wafer stage 10 is positioned in such a manner that the reference mark FM will arrive at a predetermined position within the projection field of view of the projection optics 7, the mark RMa of the reticle R and the reference mark FM will be detected simultaneously by a TTL-type mask alignment system 50a provided above the reticle R. If the wafer stage 10 is moved to another position, the mark RMb of the reticle R and the reference mark FM can be detected simultaneously by a mask alignment system 50b.

The alignment sensor 16 of the OA detection system is fixedly provided exterior to the projection optics 7 (outside the projection field of view). The optical axis of the alignment sensor 16 is parallel to the optical axis AX of the projection optics 7 at the side of the projected image. A collimation mark serving as a reference when aligning the mark or the reference mark FM on the photosensitive substrate 8 is provided on a glass plate within the alignment sensor 16 and is disposed substantially in conjugation with the projection image surface (the surface of the photosensitive substrate or the surface of the reference mark FM). A laser interferometer measures the position X1 of the wafer stage 10 when the mark RMa of the reticle R and the reference mark FM on the reference member FP have been aligned using the mask alignment system 50a. Similarly, laser interferometers measure the position X2 of the wafer stage 10 when the mark RMb of the reticle R and the reference mark FM on the reference member FP have been aligned, and the position X4 of the wafer stage 10 when an index mark of the alignment sensor 16 and the reference mark FM on the reference member FP have been aligned by the mask alignment system 50b. Let X3 represent the center position of the positions X1 and X2. The position X3 resides on the optical axis AX of the projection optics 7 and is a position conjugate with the center C of the reticle.

A baseline quantity BL is obtained by calculating the difference X3−X4. The baseline quantity BL is a reference quantity for when the alignment mark on the photosensitive substrate 8 is subsequently aligned by the alignment sensor 16 and is fed to a point directly beneath the projection optics 7. That is, let XP represent the spacing between the center of one shot (the area to be exposed) on the photosensitive substrate 8 and the alignment mark on the photosensitive substrate 8, and let X5 represent the position of the wafer stage 10 when the alignment mark on the photosensitive substrate 8 has been aligned with the index mark of the alignment sensor 16. In order to achieve agreement between the center of the shot and the center C of the reticle, it will suffice to move the wafer stage 10 to a position expressed by the following:

$$(X5-BL-XP) \text{ or } (X5-BL+XP)$$

Thus, by merely sensing the position of the alignment mark on the photosensitive substrate 8 using the alignment sensor 16 of the OA detection system and then feeding in the wafer stage 10 by a fixed amount that is related to the baseline quantity BL, the pattern on the reticle R can immediately be overlaid accurate on the shot area of the photosensitive substrate 8 to carry out exposure. It should be noted that although only a single dimension has been considered here, in actuality it is required to take two dimensions into consideration.

An apparatus described in the specification of Japanese Patent Application Laid-Open No. 9-219354 has been proposed as an example of the OA detection system in the prior art. The apparatus described in Japanese Patent Application Laid-Open No. 9-219354, which takes into account a short-term change in the measurement center of the alignment sensor, provides an index mark on the objective lens of the alignment sensor and, to the extent possible, constructs the detection system for the index mark and the detection system for the mark on the wafer of common elements, thereby reducing the effects of drift caused by heat or mechanical vibration applied to the detection systems. This improves detection precision.

When the above-described OA detection system is thus used at a position detection position for detecting the position of the wafer, the wafer stage must be driven at the time of alignment measurement and at the time of exposure because the optical axis of the projection optics and the detection area of the OA detection system are spaced apart. Owing to a change in the environment in the vicinity of the wafer stage, therefore, alignment precision is affected by fluctuation of the baseline. For example, the influence of fluctuation of the air varies depending upon a difference in interferometer length, thereby giving rise to interferometer measurement error. This causes a difference between the wafer drive grid at the time of exposure and the wafer drive grid at the time of alignment detection, thereby giving rise to a decline in alignment precision.

Accordingly, shortening the baseline as much as possible and making the environment of the wafer stage the same at the time of alignment and at the time of exposure is effective in eliminating such a decline in alignment precision. To achieve this, it is necessary that the OA detection system be placed at such a position.

The specification of Japanese Patent Application Laid-Open No. 2000-91219 describes an OA detection system in which an objective lens includes, in the order mentioned starting from the wafer side, a first lens group having a positive refracting power, a mirror for reflectively deflecting luminous flux from the first lens group, and a second lens group for condensing the luminous flux from the mirror, the system having an image sensing element for opto-electronically converting an alignment-mark image formed by the objective lens.

Another example proposed in the specification of Japanese Patent Application Laid-Open No. 11-345761 is to dispose an OA detection system in an EUV (Extreme Ultraviolet) projection apparatus in which EUV light having a wavelength of 5 to 20 nm is used as the exposing light. In accordance with this proposal, the projection optical system is constituted by a reflection optical system, in which part of a reflecting mirror constructed on the wafer side and through which the exposing light passes is cut away to provide a space. The baseline is made as short as possible by placing the OA detection system in this space.

[Reducing Apparatus Size]

Reducing the size of the exposure apparatus and peripheral equipment is vital in terms of reducing the cost of the semiconductor production facilities. The initial cost and running cost can be reduced by reducing the size of the clean room in which the exposure apparatus and peripherals are placed. Alternatively, a greater number of exposure apparatus and peripherals can be installed within a clean room to increase production volume. A reduction in the size of the exposure apparatus is proposed in the specification of Japanese Patent Application Laid-Open No. 4-352608. The exposure apparatus disclosed in Japanese Patent Application Laid-Open No. 4-352608 is reduced in size by placing an air conditioner filter in what was dead space within the chamber of the conventional exposure apparatus, whereby space is utilized more efficiently.

A cause of the baseline fluctuation that is a problem in OA detection systems is not merely drift of the measurement center position in the alignment sensor. Other examples are fluctuation in the position of the overall alignment sensor relative to the center of the projected image, and the precision with which the wafer stage is moved. Let BL represent distance from the center of the projected image to the measurement center of the alignment sensor. A change in temperature of one degree centigrade gives rise to thermal deformation of the structure supporting the projection optics and alignment sensor, where the deformation is equal to the product of BL and the coefficient of thermal expansion of the structure. If there is a yawing component $\theta$, for example, a measurement equal to $\theta \times BL$ will arise with regard to the precision with which the wafer stage is moved. Such deformation or error constitutes alignment error. In particular, since the alignment sensor of the OA detection system does not rely upon intervention of projection optics when the alignment mark on the wafer is detected, it is important that the influence of measurement error due to drift be minimized as compared with a TTL-based alignment sensor that relies upon intervention of projection optics.

In a projection exposure apparatus that uses a KrF or ArF excimer laser beam or an $F_2$ laser beam as illuminating light for the purpose of exposure, the adoption of a TTL-type alignment sensor is accompanied by a variety of technical difficulties. The off-axis alignment sensor having a high degree of freedom of design and potential functionality, therefore, takes on increased importance. However, in a case where alignment is performed using the off-axis scheme, the precision of alignment will decline in comparison with alignment using the TTL scheme unless the effects of measurement error due to baseline fluctuation are mitigated, as mentioned above.

As set forth above, reducing the wavelength of the exposing light is effective in raising the resolution of the exposure apparatus, and adopting a reflection or a reflection-refraction optical system in order to achieve this reduction in wavelength. In addition, shortening the baseline is effective in improving alignment precision. Further, reducing the size of the exposure apparatus is effective from the standpoint of lowering the cost of the semiconductor manufacturing facilities. There is no prior-art system that offers all three of these features, namely, use of a reflection-refraction optical system as the projection optical system, shortening of the baseline and reduction in the size of the apparatus.

For example, the so-called single-barrel optical projection system disclosed in the specification of Japanese Patent Application Laid-Open No. 2001-27727 having a reflection-refraction optical system as the projection optical system succeeds in raising resolution but not in improving alignment precision. Though it is possible to shorten the baseline by building the OA detection system of Japanese Patent Application Laid-Open No. 2000-91219 into the exposure apparatus having the single-barrel optical projection system disclosed in Japanese Patent Application Laid-Open No. 2001-27727, the size of the apparatus is likely to be increased by an amount equivalent to the offset of the pattern projection area from the center of the projection optical system. A wafer stage that holds and moves a wafer is required to have a movable area that allows the entire wafer surface to be exposed, with the pattern projection area being at the center. If the pattern projection area deviates from the center of the projection optical system, it is required that the placement of the wafer stage be shifted with respect to the projection optical system by the amount of deviation. The problem is that the size of the apparatus increases by an amount commensurate with the amount of the shift.

The so-called twin-barrel projection optical system disclosed in the specification of Japanese Patent Application Laid-Open No. 2001-15405 succeeds in raising resolution, but not in improving alignment precision. Even if the OA detection system disclosed in the specification of Japanese Patent Application Laid-Open No. 2000-91219 is incorporated, as in the manner of the above-described single-barrel scheme, the very fact that the arrangement has twin barrels results in an apparatus of a large size.

Further, the EUV exposure apparatus disclosed in the specification of Japanese Patent Application Laid open No. 11-345761 succeeds in raising the resolution of the exposure apparatus and in improving alignment precision, but has a projection optical system that itself is large in size. This results in a large-size apparatus. With regard to the improvement in alignment precision, the fact that the projection optical system is of a reflection type means that the optical components constructed on the side of the wafer are mirrors. This system is realized by cutting away the portion through which the exposing light is transmitted. If the single-barrel reflection-refraction optical system is adopted, using mirrors for the optical components arranged on the side of the wafer poses difficulties in terms of optical design. As a consequence, the apparatus is limited to a case where the reflection-type optical system is used.

Furthermore, since this apparatus is an EUV exposure apparatus, the arrangement is premised on the fact that a vacuum exists within the apparatus. A chamber having a vacuum-supporting structure is required and, as a result, there is a further increase in the size of the apparatus. Even if a vacuum pump for establishing the vacuum is constructed on the facility side or on the side of the exposure apparatus, the size of the apparatus is increased owing to the provision of the pump. Furthermore, there is a marked increase in power consumption and an increase in the cost of the manufacturing facilities.

In the case of Japanese Patent Application Laid-Open No. 11-345761, the mask illumination area is placed at a position that is off-centered by an amount greater than the amount by which the pattern exposure area is offset from the center of the optical projection system. Moreover, the mask illumination area is off-centered in a direction opposite from that in which the pattern projection area is formed relative to the center of the projection optical system. This increases the size of the apparatus even further.

In the case also of the single-barrel optical projection system disclosed in the specification of Japanese Patent Application Laid-Open No. 2001-27727, an offset from the center of the projection optical system results not only in off-centering of the pattern projection area but also in off-centering of the reticle illumination area in a manner similar to that of the exposure apparatus described in Japanese Patent Application Laid-Open No. 11-345761. Since the relationship between the amount of off-centering and the size of the exposure apparatus is not taken into account at all, the amount of off-centering itself leads to an increase in the size of the apparatus.

Further, the exposure apparatus disclosed in Japanese Patent Application Laid-Open No. 4-352608 is satisfactory in terms of size reduction but does not deal with improvements in resolution and alignment.

SUMMARY OF THE INVENTION

The present invention has been devised in view of the above-mentioned problems and its object is to provide an exposure apparatus in which the effects of measurement error due to baseline fluctuation can be mitigated and the position of an object to be detected (the position detection mark) can be detected highly precisely so that highly accurate alignment can be achieved.

Another object of the present invention is to provide an exposure apparatus in which resolution is raised by reducing the wavelength of exposing light through utilization of a reflection-refraction optical system, in which alignment precision is improved by shortening the baseline, and in which the apparatus can be reduced in size.

According to the present invention, the foregoing objects are attained by providing an exposure apparatus comprising: an illuminating optical system for illuminating a reticle with illuminating light from a light source; a projection optical system for projecting a pattern, which has been formed on the reticle, onto a photosensitive substrate; and a position detection system for detecting an alignment mark on the substrate; wherein a pattern projection region for projecting the pattern onto the substrate by the projection optical system is formed at a position off-centered toward the side of the position detection system from the projection center of the projection optical system.

The present invention further provides a device manufacturing method for manufacturing a device by the above-described exposure process.

The present invention further provides a semiconductor device manufacturing plant having a group of manufacturing equipment for various processes, inclusive of any of the exposure apparatus described above, wherein information relating to at least one of the pieces of manufacturing equipment can be communicated by data communication using a local-area network and/or an external network outside the plant.

The present invention further provides a method of maintaining the above-described exposure apparatus.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 3 is a diagram showing a region in which an image is formed on a wafer surface in an embodiment of the present invention;

FIG. 13 is a diagram illustrating a specific example of a user interface;

DESCRIPTION OF THE PREFERRED EMBODIMENTS

Preferred embodiments of the present invention will now be described in accordance with the accompanying drawings.

<First Embodiment>

According to a first embodiment of the invention, described below, note is taken of the fact that making the length of the baseline BL as small as possible is effective in mitigating the effects of measurement error caused by drift, and of the fact that it is possible to form the pattern image off-center with respect to the optical axis or lens barrel of the projection optical system. On the basis of these considerations, an off-axis-type alignment sensor is disposed on the side on which the pattern image is off-centered.

Figure 4:
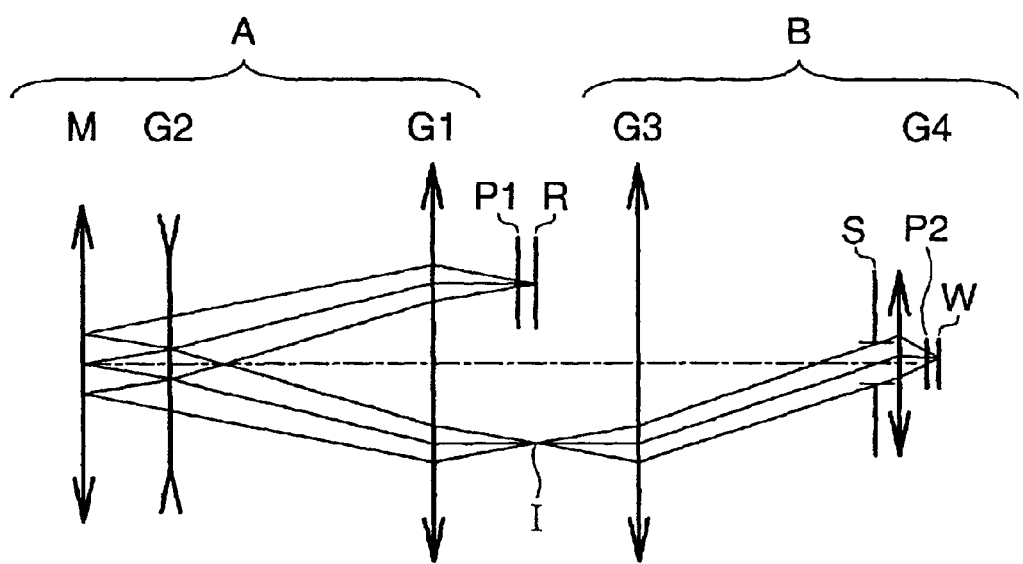
FIG. 4 is a schematic view illustrating a reflection-refraction exposure optical system according to an embodiment of the present invention.
Figure 5:
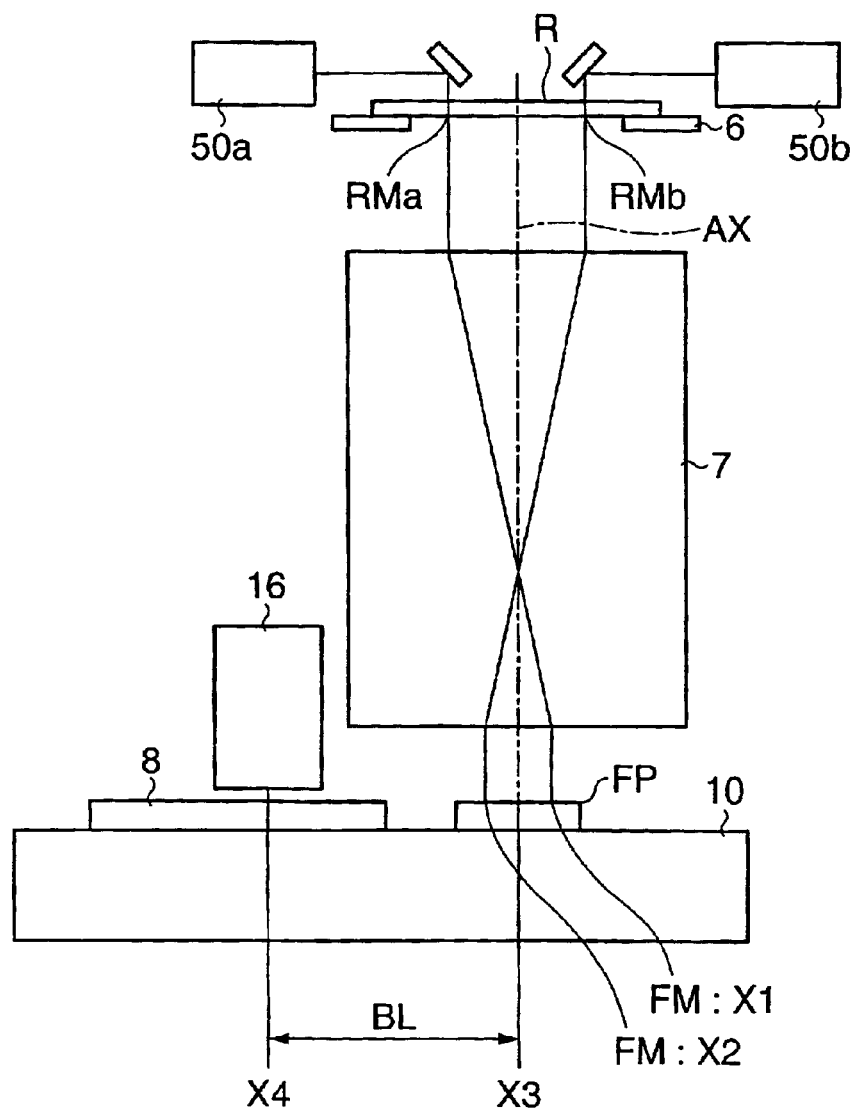
FIG. 5 is a diagram useful in describing general baseline measurement.

FIG. 4 is a conceptual view useful in describing the basic construction of a reflection-refraction projection optical system in an exposure apparatus to which the present invention is applied. The projection optical system shown in FIG. 4 is constituted by a reflection-refraction optical system A and a refraction optical system B disposed on opposite sides of an intermediate image I. A projection image on a mask R is acted upon by this projection optical system. Specifically, the intermediate image I is formed by the reflection-refraction optical system A, which is a first image-formation optical system, and the image of the mask pattern is formed on a wafer W by the refraction optical system B, which is a second image-formation optical system.

The direction of the optical axis of the projection optical system is changed by a concave reflecting mirror and the members of the reflection optical system and refraction optical system are disposed on the optical axis. The reflection-refraction optical system A and refraction optical system B will be described without touching upon the existence of reflecting surfaces for bending the optical path.

The reflection-refraction optical system A comprises a plurality of lenses (G1, G2) and a first concave reflecting mirror (M). It is necessary that the mask R in the reflection-refraction optical system A be placed at a position that is off-center with respect to the optical axis. If the mask R were placed on the optical axis of the reflection-refraction optical system A, the light that illuminates the mask R would be reflected by the concave reflecting mirror M upon passing through the lenses G1, G2 and would then return to the mask R via the lenses G1, G2 again. As a result, the illuminating light would interfere with the returning light. In order to avoid such interference, it is necessary that the surface of the mask R be offset (off-centered) from the optical axis to separate the light incident upon the concave reflecting mirror M from the emitted light reflected by the concave reflecting mirror M. Further, it is necessary that the surface of the wafer W also be off-centered from the optical axis to deal with the off-centering of the mask R from the optical axis.

As a result, a usable region FR in FIG. 3, which is a region of the wafer W in which the pattern image of the mask R can be projected, is a semi-circular region within a circular region, the center of which is the optical axis AX of the projection optics. An exposure region ER upon which the pattern image of the mask R is actually projected and which is used in exposure of the wafer W is, e.g., a rectangular region within the semi-circular usable region FR. The region ER takes into consideration some leeway with respect to the wafer boundary relative to the optical axis AX.

Figure 1:
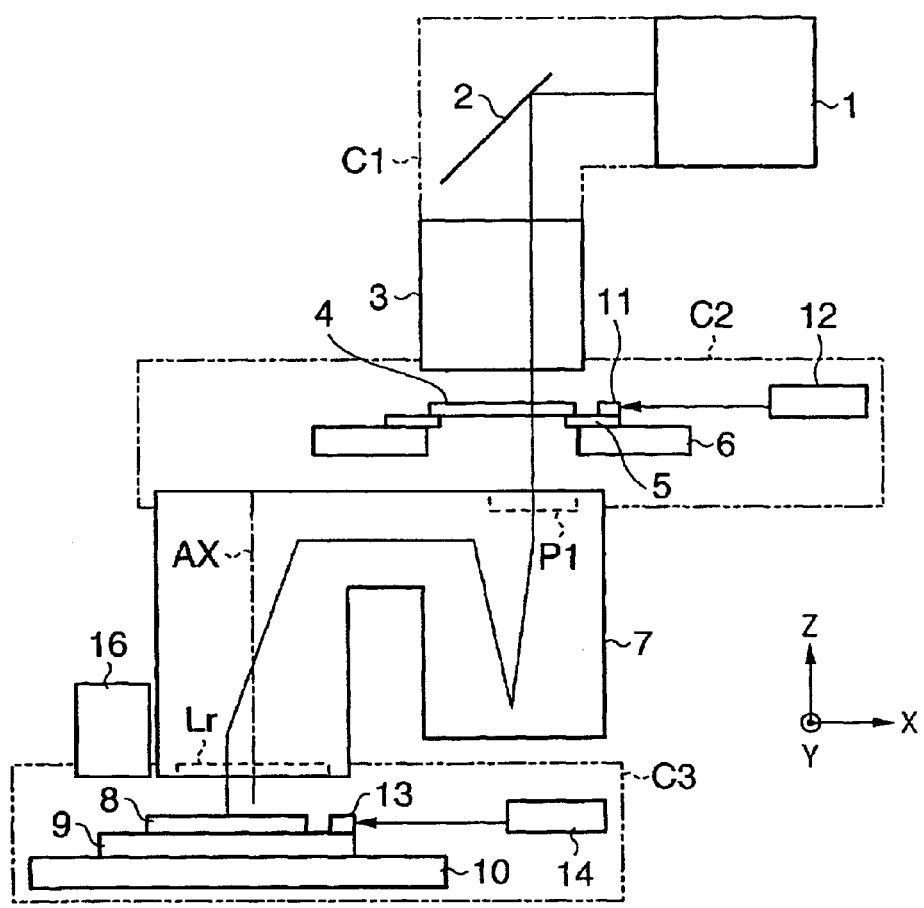
FIG. 1 is a schematic view illustrating an example of an exposure apparatus to which the present invention is applied.

FIG. 1 is a diagram showing the structure of the exposure apparatus according to the present invention. This exposure apparatus is such that the exposure region ER occupies a position off-centered a distance LX from the optical axis AX by constructing an off-axis optical system from the reflection-refraction projection optical system 7. This is a case in which the exposure region ER is off-centered from the optical axis AX. However, similar results may be obtained by off-centering the exposure region ER from the center of the lens barrel.

It will suffice if the off-axis alignment sensor 16 is placed in the vicinity of the projection optical system 7 at a position at which the alignment mark on the wafer 8 can be observed. In this arrangement of the present invention, the off-axis alignment sensor 16 is placed on the side near the exposure region ER relative to the optical axis AX. This makes possible an arrangement in which the baseline BL is minimized in length.

(Embodiment of Exposure Apparatus)

The details the exposure apparatus according to this embodiment of the invention will be described with reference to FIG. 1.

FIG. 1 is a diagram schematically illustrating the overall structure of a projection exposure apparatus according to this embodiment of the present invention. In FIG. 1, the Z axis is taken as the direction of the normal to the wafer surface, the X axis is taken parallel to the plane of the drawing in the plane of the wafer, and the Y axis is taken perpendicular to the plane of the drawing.

In the projection optical system illustrated, the light emitted along the X direction from an $F_2$ laser (center wavelength 157.6 nm) 1 is deflected in the z direction by a bending mirror 2, after which, a mask 4 is illuminated uniformly via an illuminating optical system 3. In FIG. 1, only one bending mirror 2 is illustrated on the optical path from the light source 1 to the illuminating optical system 3. In actuality, however, an optical system such as a light regulating optical system and a section for adjusting the quantity of light is disposed on the optical path.

Since an $F_2$ laser is being used as the light source, basically, a sealed structure is adopted to reduce absorption gas present along the optical path. The light source 1 and illuminating optical system 3 are connected by a casing C1. The connections have a hermetically sealed structure. The casing C1 also is hermetically sealed and the space within the casing filled with an inert gas such as helium. It should be noted that the bending of the optical path is not limited to that shown in FIG. 1. A pattern to be transferred is formed on the mask 4, and the mask 4 is held on a mask stage 6 via a mask holder 5. The mask 4 has an illuminated rectangular region, the longitudinal direction of which is the Y direction. The mask stage 6 is movable in two dimensions along the plane of the mask by a drive system, not shown. The positional coordinates of the mask stage 6 are measured by a mask moving mirror 11 and interferometer 12, and the position of the mask stage 6 can be controlled based upon the result of measurement.

The light that illuminates the mask 4 forms the pattern image of the mask on the wafer 8 via the projection optical system 7.

The structure of the projection optical system 7 may be of the same type as that of the reflection-refraction optical system disclosed in, e.g., the specification of Japanese Patent Application Laid-Open No. 8-334695. This structure need not be described again.

The wafer 8, on the other hand, is placed on the wafer stage 10 by a wafer transport device (not shown), and is held on the wafer stage 10 in the X-Y plane via a wafer holder 9.

The alignment sensor 16 constituting the off-axis position detector is placed above the wafer 8. The alignment mark on the wafer 8 is detected by the alignment sensor 16.

The rectangular pattern image designed such that its longitudinal direction is the Y direction is formed on the wafer 8 so as to optically correspond to the rectangular illumination pattern that illuminates the mask 4. The wafer stage 10 is capable of being moved in two dimensions along the wafer plane by a drive system, not shown. The positional coordinates of the wafer stage 10 are measured by a wafer moving mirror 13 and interferometer 14, and the position of the wafer stage 10 can be controlled based upon the result of measurement.

In order to hold the interior of the projection optical system 7 in a hermetically sealed state, a plane-parallel plate P1 is disposed on the side near the mask 4 to provide a sealed structure. A lens Lr disposed on the side near the wafer 8 also has a sealed structure. The interior of the projection optical system 7 is filled with helium gas in order to reduce the absorption of the exposing light. Similarly, the optical path from the light source 1 to the illuminating optical system 3 also is filled with helium gas. The mask 4 and mask stage 6 are placed inside a casing C2, the interior of which is filled with an inert gas such as nitrogen or helium.

The wafer 8 and wafer stage 10 are placed inside a casing C3. The interior of the casing C3 also is filled similarly with an inert gas such as nitrogen or helium.

The mask stage 6 and the wafer stage 10 are scanned synchronously in a direction that perpendicularly intersects the rectangular illumination region or exposure region formed to have its longitudinal direction along the Y axis, whereby the wafer 8 is scanned by and exposed to the mask pattern. Thus, the exposure apparatus of this embodiment has the structure of a scanning-type exposure apparatus. However, this does not impose a limitation upon the invention. For example, the exposure apparatus may be of the stationary type.

Figure 2A:
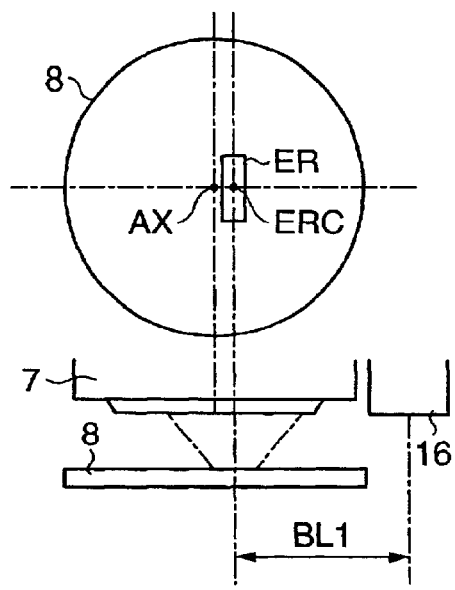
FIG. 2A is a diagram useful in describing the distance between the measurement center of an alignment sensor and the center of an exposure region in a case wherein the present invention is applied.
Figure 2B:
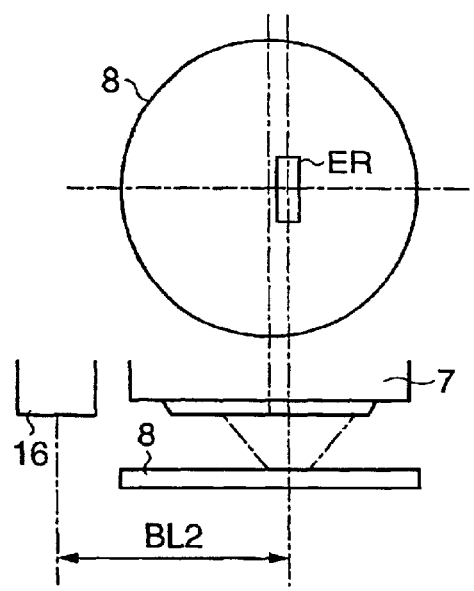
FIG. 2B is a diagram useful in describing the distance between the measurement center of an alignment sensor and the center of an exposure region in a case wherein the present invention is not applied.

FIGS. 2A and 2B illustrate placement of the alignment sensor (mark detection system) and the vicinity of the wafer according to this embodiment. FIG. 2A shows a case where the present invention is applied and FIG. 2B a case where the present invention is not applied. In FIGS. 2A and 2B, the lower drawing is an elevational view and the upper drawing is a plan view of the wafer. FIG. 2A shows a case where the alignment sensor 16 is placed on the side of the optical axis AX being the projection center of the alignment sensor 16 to the center of the projection optical system 7. A distance BL1 from the measurement center of the alignment sensor 16 to the center of the exposure region ER in this case is the baseline. On the other hand, FIG. 2B shows a case where the alignment sensor 16 is placed on the side of the region ER. The baseline in this case is BL2. By applying the present invention, the alignment sensor 16 can be disposed to shorten the baseline by the distance BL2−BL1, which is the difference between the baseline quantities due to position at which the alignment sensor 16 is placed.

Preferably, the measurement center of the alignment sensor 16 resides on the exposure-region side of the optic axis AX on a straight line that passes through optical axis AX in FIG. 2A and the center C of the exposure region ER.

Thus placing the alignment sensor 16 along a line connecting the optical axis to the center of exposure is preferred. However, the present invention is not limited solely to arrangement in this direction. For example, if the pattern projection region is formed at a position off-centered toward the position detection system with respect to the optical axis of the projection optical system, i.e., if the alignment sensor 16 is placed at the circumferential portion of the semicircular usable region FR shown in FIG. 3 (on the side, relative to the optical axis AX, on which the pattern projection region on the substrate is present), then the alignment sensor 16 can be placed such that the baseline can be made shorter than when the alignment sensor 16 is placed at the circumferential portion of this region on the opposite side of the optical axis. Furthermore, if a line extending in the longitudinal direction of the pattern projection region from the center of exposure is imagined and the alignment sensor 16 is placed on the side opposite the optical axis with this line serving as the reference, then the baseline can be shortened even further.

Thus, the above-described embodiment is such that if an off-axis-type alignment sensor is disposed in an exposure apparatus having a projection optical system in which a reflection-refraction projection region using short wavelength light such as that from an $F_2$ laser light as the light source is offset with respect to the projection center, then the alignment sensor can be placed so as to minimize the length of the baseline. As a result, a position detector can be provided in which it is possible to reduce measurement error caused heretofore by heat- or vibration-induced fluctuation in the position of the overall alignment sensor with respect to the center of the projected image, or by poor precision in movement of the wafer stage, and in which the position of an object to be detected (a position detection mark) can be detected in highly precise fashion. This makes it possible to provide an exposure apparatus having high resolution and excellent alignment precision.

A case in which the exposure region is offset from the optical axis of the projection optical system has been described in this embodiment. However, in a case wherein the exposure region is offset with respect to the center of the lens barrel, then it will suffice to similarly dispose the alignment sensor 16 on the side on which the exposure area has been offset, i.e., on the side where placement makes it possible to shorten the distance from the center of measurement of the alignment sensor 16 to the center of the exposure region. Furthermore, even in a case where the lens barrel is not symmetrical, it will similarly suffice to place the alignment sensor 16 on the side where placement makes it possible to shorten the distance from the measurement center of the alignment sensor 16 to the center of the exposure region if the exposure region has been offset with respect to the center of the cross-sectional area of the lens barrel. Further, a case in which the projection optical system is of the reflection-refraction type has been described in the above example. However, another type of optical system, such as a refraction or reflection type, may be used. If the baseline can be shortened by forming the exposure region off-center and placing the alignment sensor on the side on which the exposure region has been off-centered, then effects similar to those of the above example will be obtained.

<Second Embodiment>

In an exposure apparatus according to a second embodiment, which utilizes the principle discussed in the first embodiment, the projection optical system is made an optical system of the reflection type, the baseline is shortened and the size of the apparatus is reduced.

The features that characterize the exposure apparatus according to the second embodiment will now be described with reference to FIG. 6. The exposure apparatus according to this embodiment includes a projection optical system 24 for projecting the pattern of a mask (reticle R) onto a substrate (wafer W), a wafer stage 27 capable of holding and moving the wafer, a wafer transport system (33, 35) for transporting the wafer to the wafer stage 27, and a position detecting system (OA detection system 68) for detecting an alignment mark on the wafer. The projection optical system 24 projects the reticle pattern on the wafer. The projection area of the pattern is formed at a position offset from the projection center of the projection optical system. The wafer transport system (33, 35) is placed on the side of the projection region relative to the center of projection.

The OA detection system 68 is disposed between the wafer transport system (33, 35) and the projection optical system 24. It is possible for a plurality of OA detection systems to be placed within the exposure apparatus. For example, in a case where two OA detection systems are provided, they may be disposed along mutually perpendicular X and Y directions passing through the center, or substantially the center, of the projection region and lying parallel to the exposure surface of the wafer. This will make it possible to detect the position of the alignment mark along the Y direction by the OA detection system disposed along the X direction and the position of the alignment mark along the X direction by the OA detection system disposed along the Y direction.

As mentioned above, the exposure apparatus is required to have improved resolution, higher alignment precision and lower initial running costs of the manufacturing facilities. In the exposure apparatus of this embodiment, the wavelength of the exposing light is shortened to raise resolution, and a reflection or refraction optical system is adopted as the projection optical system 24 in order to deal with this. By adopting a reflection or refraction projection optical system, the projection region of the reticle pattern formed on the wafer is formed at a position offset with respect to the projection center of the projection optical system. By taking note of this fact, the OA detection system 69 is placed on the side of the projection region, which is formed at the off-centered position, with respect to the projection center of the projection optical system 24, thereby shortening the baseline and raising alignment precision. Furthermore, by placing the wafer transport system (33, 35) on the side of the projection region formed at the off-centered position, a reduction in the size of the apparatus is realized and, hence, so is a reduction in the cost of the manufacturing facilities.

Further, with regard to the mechanism relating to the reticle R, a reticle stage 26 capable of holding and moving the reticle, and a reticle transport system 31 for transporting the reticle to the reticle stage 26 are provided. The illumination region on the reticle formed by an illuminating system 23 for illuminating the reticle with exposing light is formed at a position offset with respect to the projection center of the projection optical system 24. The reticle transport system 31 is disposed on the side of the illumination region with respect to the center of projection.

In this case wherein the projection optical system 24 is of the reflection or refraction type, not only the projection region of the reticle pattern on the wafer but also the illumination region on the reticle illuminated by the illuminating system 23 are formed off-center with respect to the projection center of the projection optical system 24. Upon taking this into consideration, the reticle transport system 31 is disposed on the side of the illumination region with respect to the projection center of the projection optical system, thereby making it possible to reduce the size of the apparatus and lower the initial and running costs of the manufacturing facilities.

Furthermore, in the arrangement described above, the projection region on the wafer and the illumination region on the reticle are formed at positions offset to the same side, and preferably in the same direction, with respect to the projection center of the projection optical system 24, and the reticle transport system 31 and wafer transport system (33, 35) are disposed on the side of the projection region and illumination region with respect to the center of projection.

In accordance with this arrangement, the wafer transport system, OA detection system and reticle transport system within the chamber of the exposure apparatus are disposed more appropriately.

In case of an arrangement in which the projection optical system 24 is a reflection optical system or a reflection and refraction optical system in which the number of times of the reflection light is an even number, and an intermediate image is formed within the projection optical system, the projection region of the reticle pattern formed on the wafer via the projection optical system and the mask illumination region on the reticle illuminated by the illuminating system 23 are formed at positions off-centered in the same direction with respect to the projection center of the projection optical system. Upon taking this into consideration, the reticle transport system and the wafer transport system are disposed on the side of the projection region and illumination region with respect to the projection center, thereby making it possible to reduce the size of the apparatus and lower the initial and running costs of the manufacturing facilities.

The second embodiment will now be described in greater detail.

Figure 6:
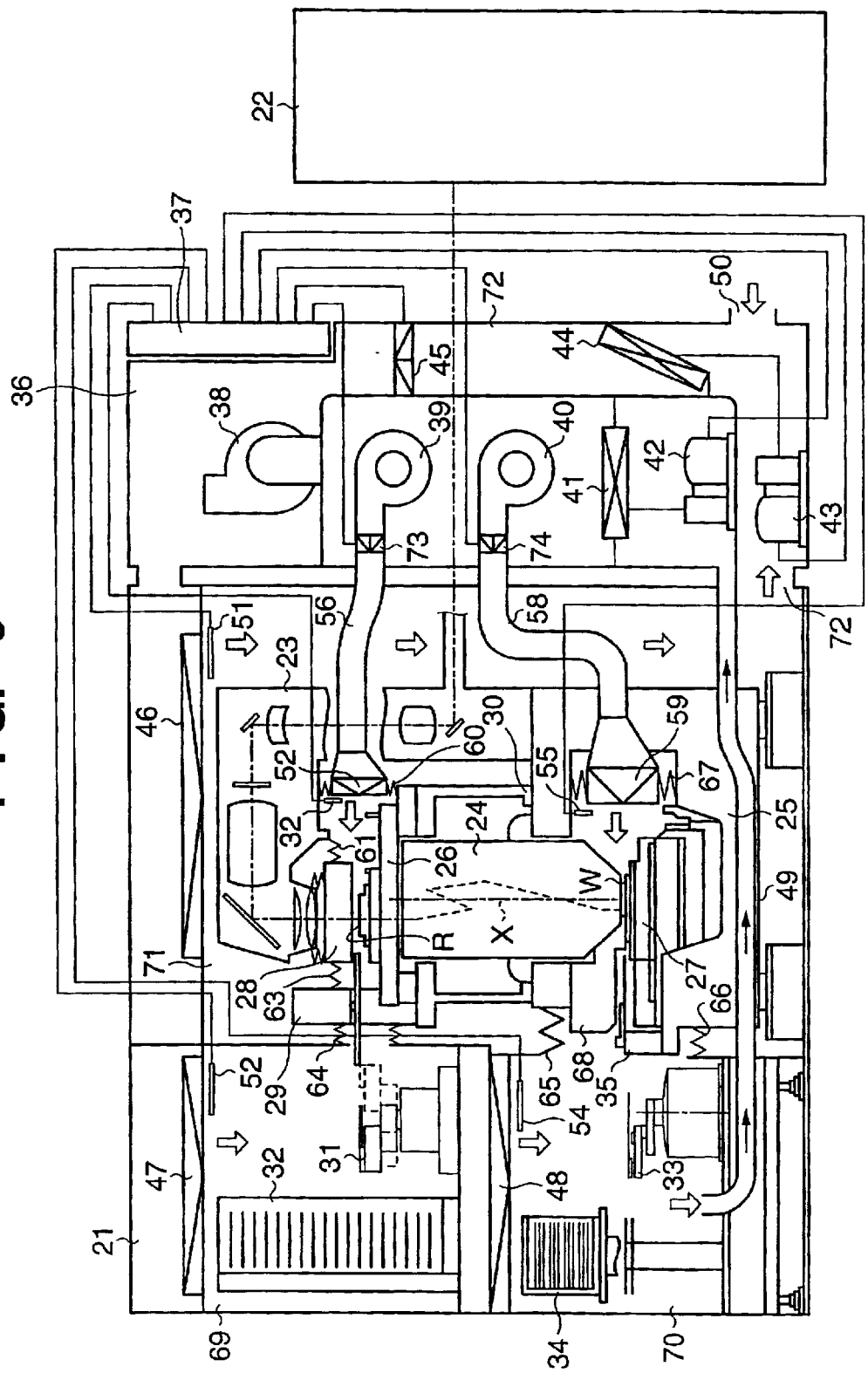
FIG. 6 is a diagram showing the structure of an exposure apparatus according to a second embodiment of the present invention.

As shown in FIG. 6, the main body of the exposure apparatus is accommodated within a chamber 21 and the ambient temperature is adjusted to a precision of, e.g., ±0.03° C. The wafer stage 27, projection optical system 24 and illuminating system 23 are mounted on a structure 25. The reticle stage 26 is mounted via a structure 30.

The illuminating system 23 irradiates the reticle R, which is held on the reticle stage 26, with illuminating light of a predetermined wavelength. The illuminating light is guided to the illuminating system 23 from an $F_2$-laser light source 22. Examples of the illuminating light that can be mentioned are excimer laser light such as KrF, ArF and $F_2$ laser light, and higher-harmonic or i-ray ultraviolet light such as that of a YAG laser or metal vapor laser. The illuminating system 23 is a sealed or substantially sealed structure, the interior of which is filled with an inert gas, such as nitrogen or helium, the temperature and humidity of which have been regulated.

Figure 7:
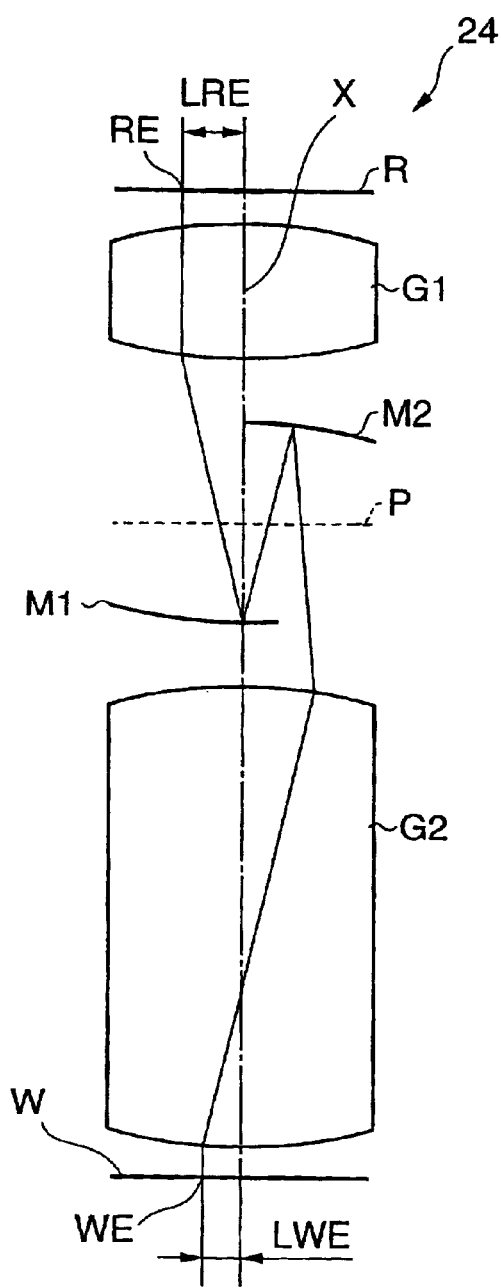
FIG. 7 is a diagram showing the concept of the reflection-refraction optical system.

The projection optical system 24 is a twin-barrel reflection-refraction optical system similar to the projection optical system disclosed in the specification of Japanese Patent Application Laid-Open No. 2001-27727. The projection optical system 24 is a sealed structure, the interior of which is filled with an inert gas, such as nitrogen or helium, the temperature and humidity of which have been regulated. As shown in FIG. 7, the interior of the projection optical system 24 has an intermediate image surface P and two reflection surfaces.

FIG. 7 is a schematic view showing the optical structure of the projection optical system 24. Exposing light that has passed through the reticle R travels through an optical system G1, is reflected by mirrors M1, M2 and irradiates the wafer W via an optical system G2. The mirror M2 has a shape from which a portion that is not used in reflecting the exposing light is eliminated in order to allow passage of the exposing light directed toward the mirror M1. Similarly, the mirror M1 has a shape from which a portion that is not used in reflecting the exposing light is eliminated in order to allow passage of the exposing light directed from the mirror M2 to the optical system G2.

An illumination region RE of the reticle R is formed at a position off-centered by LRE from the optical axis X. Further, a projection region WE of the reticle pattern formed on the wafer W is formed at a position off-centered by LWE from the optical axis X.

Figure 8:
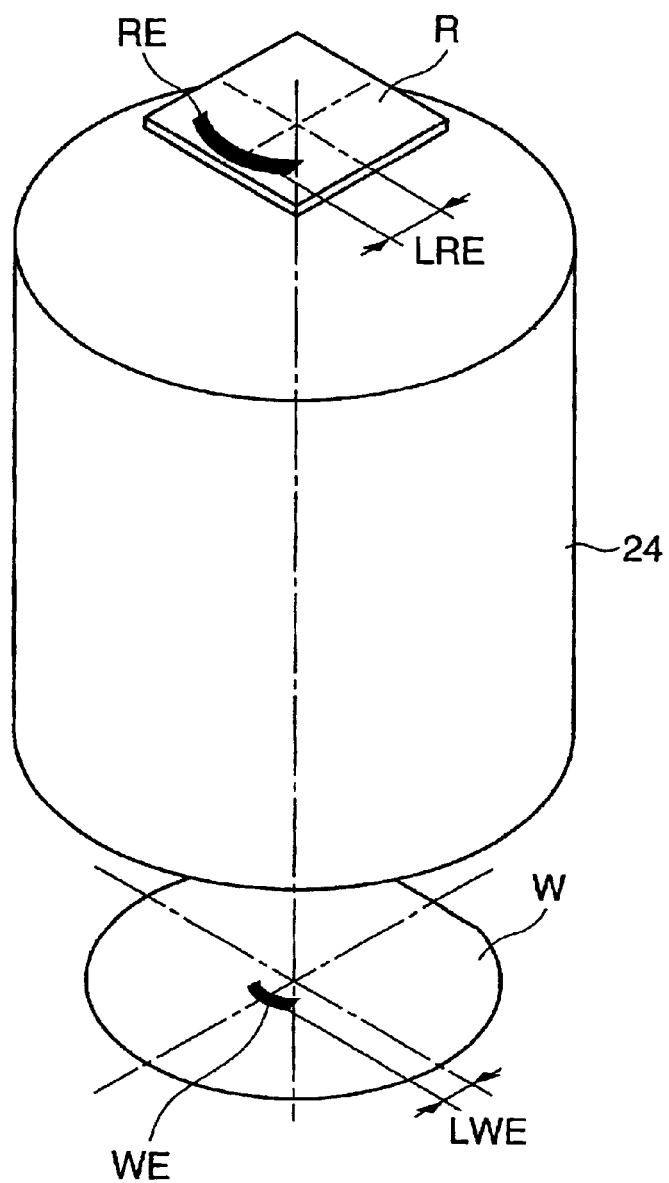
FIG. 8 is a diagram showing the concept of an illumination region and a projection region.

The disposition of the illumination region RE and of the projection region WE of the reticle pattern is shown in FIG. 8. The illumination region RE and the projection region WE of the reticle pattern are off-centered by LRE and LWE, respectively, in the same direction with respect to the optical axis X.

With reference again to FIG. 6, the wafer stage 27 has its position measured by an interferometer (not shown) and is capable of being driven along the direction Z of the optical axis of projection optical system 24, along directions X and Y perpendicular to the direction Z, and in directions ωx, ωy, ωz about these axes X, Y, Z, respectively. Further, the reticle stage 26 has its position measured by an interferometer (not shown) and is capable of being driven along directions X and Y perpendicular to the direction Z of the optical axis of the projection optical system 24.

Disposed above the wafer stage 27 is the OA detection system 68 for detecting a mark on the wafer or a reference mark on the wafer stage 27. Though only one OA detection system 68 is shown in FIG. 6, it is possible to provide a plurality of OA detection systems. In a case where a plurality of OA detection systems are provided, the other OA detection systems are disposed along directions that perpendicularly intersect the OA detection system 68 along a direction perpendicular to the plane of the drawings. The OA detection system 68 shown in FIG. 6 is disposed to detect the position of the wafer W along the direction perpendicular to the plane of the drawing, and the OA detection systems that are not shown are disposed to detect the position of the wafer W in a direction along the plane of the drawing. Also, a single OA detector, which can detect positions in the two directions, may be used as the OA detection system 68.

By virtue of illumination provided by the illuminating system 23, the image of the pattern on the reticle R is projected via the projection optical system 24 upon the wafer held on the wafer stage 27. At this time, the wafer stage 27 and the reticle stage 26 are moved relatively along the Y direction perpendicular to the direction Z of the optical axis of projection optical system 24. As a result, the pattern image is transferred to the predetermined region on the wafer W. A similar transfer operation is repeated with regard to a plurality of exposure regions on the wafer W by the step-and-scan method, whereby pattern transfer is performed with regard to the entire surface of the wafer W.

The reticle R is accommodated in a reticle storage area 32 and is transported by the reticle transport system 31. The reticle storage area 32 and reticle transport system 31 are disposed in a space 69 within the chamber. The reticle R is transported to a reticle alignment unit 29 by the reticle transport system 31. The reticle alignment unit 29 is secured on the structure 30, places the reticle R on the reticle stage 26 or recovers the reticle from the reticle stage 26, and aligns the reticle R.

The wafer W, on the other hand, is accommodated in a wafer storage area and is transported by the wafer transport system 33. The wafer storage area 34 and the wafer transport system 33 are disposed in a space 70 within the chamber. The wafer W is transported to a wafer delivery unit 35 by the wafer transport system 33. The wafer delivery unit 35 is secured to the structure 25 and places the wafer W on the wafer stage 27 or recovers the wafer from the wafer stage 27.

The wafer W that has been transported to the wafer stage 27 by the wafer delivery unit 35 has its alignment mark detected by the detection system 68, whereby the position of the wafer is detected. This detection of position includes first performing prealignment using a prealignment mark and then detecting the position of the wafer W highly precisely by the alignment mark.

The structure of the chamber of the exposure apparatus will now be described. The chamber is constituted by a chamber portion 21 that accommodates the apparatus main body, an air conditioning unit 36 and a controller 37 for the air conditioning unit, etc. The chamber portion 21 is partitioned into a space 71 that accommodates the apparatus main body, a space 69 that accommodates the reticle transport units, and a space 70 that accommodates the wafer transport unit.

Air whose temperature has been regulated by a coolant circulator 43, heat exchanger 44, air conditioner 45, blower fan 38 and thermometer 51, which are controlled by the controller 37, is blown into a space 71 via a filter 46. Thus is constructed a circulation system in which blown air passes through the interior of the space 71 and returns to the air conditioning unit 36 via a return section 72 so that its temperature is regulated. The space 71 has a substantially sealed structure and is constructed so as to exhibit positive pressure with respect to the exterior. The space 71 is formed to have an outside air intake port 50 for introducing outside air in order to compensate for leakage from the substantially sealed structure.

For the spaces 69, 70 a circulation system is constructed by a coolant circulator, heat exchanger, air conditioner and blower fan, which are not shown, and thermometers 52, 54 in a manner similar to that of the space 72, and air is blown through the spaces 69, 70 via filters 47, 48, respectively. Unlike the space 71, the space 69 is connected to the space in which the reticle is irradiated and the space 70 is connected to the space in which the wafer is exposed. These spaces therefore are constructed as spaces in which an inert gas such as nitrogen is circulated. Accordingly, the air conditioning unit 36 is divided into a section for air conditioning the air that circulates through the space 71 and a section for air conditioning the inert gas that circulates through the spaces 69, 70. A return section 49 for circulation is constructed in the space 70 to construct a circulation path that is isolated from the air in the space 71. The space 69 also is provided with a similar return section, not shown.

The reticle area of the apparatus connected to the space 69 also is air conditioned by inert gas. Inert gas whose temperature has been regulated by a coolant circulator 42, heat exchanger 41, air conditioner 73, blower fan 39 and thermometer 32, which are controlled by the controller 37, is blown via a blower duct 56 and filter 52. The filter 52 is connected to the illuminating system 23 and reticle stage 26 by a connecting member 60 in order to achieve isolation from the space 71. The connecting member 60 is airtight and is constituted by a resin material or the like in the form of a bellows in order to prevent the transfer of vibration. The space 69 and the reticle alignment unit 29 similarly are connected by a connecting member 64.

A TTL decision system 28 is constructed above the reticle stage 26. The TTL detection system 28 is connected to the illuminating system 23 and reticle alignment unit 29 by connecting members 61, 62, 63.

In a manner similar to that of the reticle area of the main body of the apparatus, the wafer area is air conditioned by inert gas. Inert gas whose temperature has been regulated by a coolant circulator 42, heat exchanger 41, air conditioner 74, blower fan 40 and thermometer 55, which are controlled by the controller 37, is blown via a blower duct 58 and filter 59. The filter 59 is connected by a structure 25 and connecting member 67 to achieve partitioning from the space 71. Further, the space 70 also is connected to the wafer area by connecting members 65, 66.

The operation of the exposure apparatus according to this embodiment constructed as set forth above will now be described.

Figure 9A:
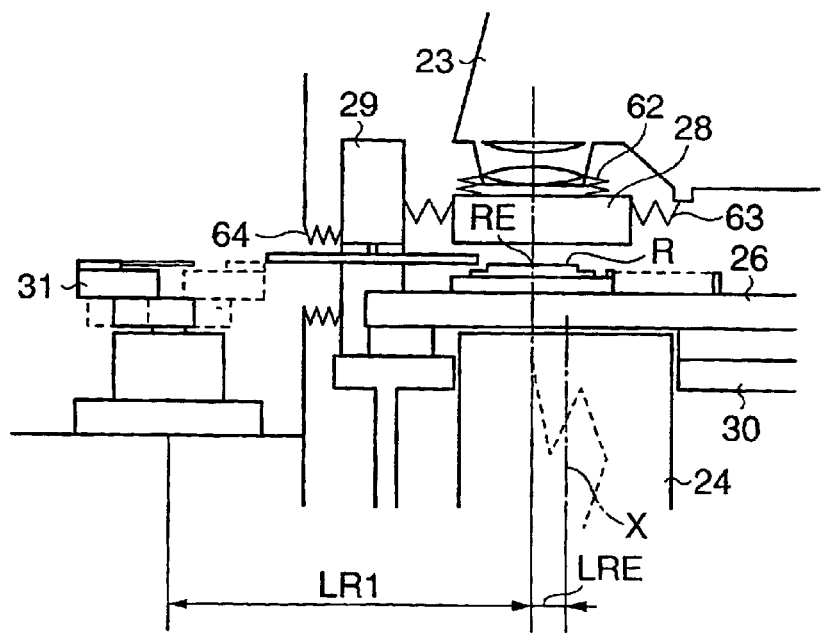
FIG. 9A is a diagram showing a reticle area according to the second embodiment.
Figure 9B:
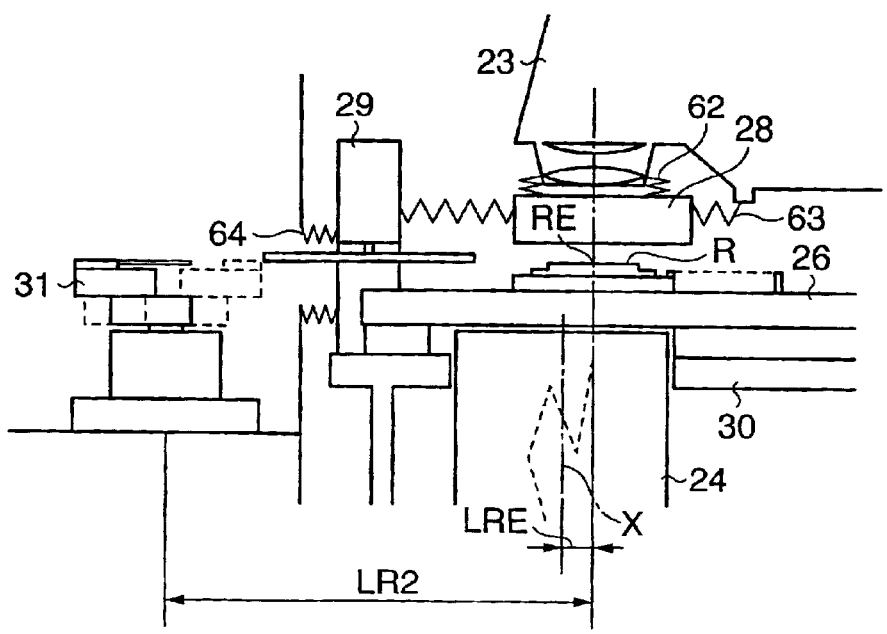
FIG. 9B is a diagram showing a reticle area to which the present invention is not applied.

FIGS. 9A and 9B illustrate reticle areas, in which components identical with those shown in FIG. 6 are not described again. FIG. 9A illustrates an embodiment to which the present invention is applied. By virtue of the structure of the projection optical system 24, the illumination region RE of the reticle R is formed at a position off-centered from the optical axis X by LRE. The reticle transport system 31 and reticle alignment unit 29 are placed on the side of the illumination region RE, as shown in FIG. 9A. Owing to this arrangement, the distance between the illumination region RE and reticle transport system 31 is LR1.

By contrast, in FIG. 9B. to which the present invention is not applied, the reticle transport system 31 and reticle alignment unit 29 are placed on the side of the optical axis X that is opposite the illumination region RE. In accordance with this arrangement, the distance between the illumination region RE and reticle transport system 31 is LR1.

If FIGS. 9A and 9B are compared, it will be understood that the space occupied by the arrangement of FIG. 9A can be reduced by the difference between LR1 and LR2, namely by 2LRE. In FIG. 9B, it is possible to place the reticle alignment unit 29 close to the illumination region RE. However, in order to arrange it so that the reticle alignment unit 29 will not interfere with the projection optical system 24, it is necessary for the reticle alignment unit 29 to be disposed using a structure that extends perpendicular to the plane of the drawing. This requires that space be available in the direction perpendicular to the plane of the drawing. In a case wherein the space along the direction of the plane of the drawing is the same, an arrangement can be realized in which the distance between the illumination region RE and reticle transport system 31 is shortened by adopting the arrangement shown in FIG. 9A, thereby making it possible to reduce the size of the apparatus. Even if it is attempted to place the reticle alignment unit 29 close to the illumination region RE in FIG. 9B, it can only be brought close enough so that the structure 30 and the space 69 will not interfere.

Figure 10A:
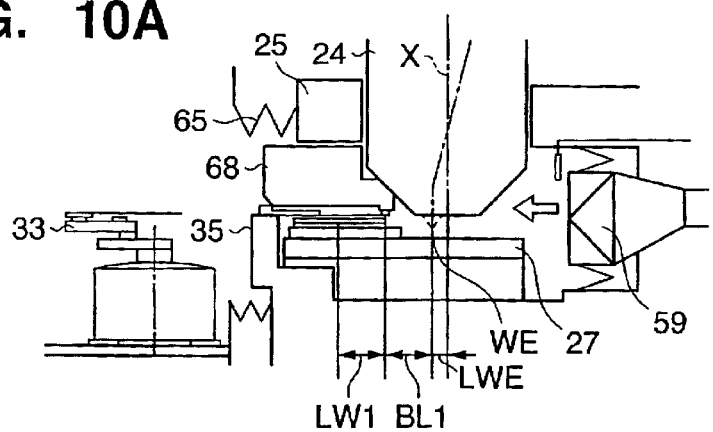
FIG. 10A is a diagram showing a wafer area according to the second embodiment.

The wafer area will be described with reference to FIGS. 10A to 10C, in which components identical with those shown in FIG. 1 need not be described. FIG. 10A illustrates an embodiment to which the present invention is applied. By virtue of the structure of the projection optical system 24, the projection region WE of the reticle pattern formed on the wafer W is formed at a position off-centered from the optical axis X by LWE. The wafer transport system 33, wafer delivery unit 35 and detection system 68 are placed on the side of the projection region WE.

The detection system 68 is placed at a position spaced away from the projection region WE by a distance BL1. The distance between the detection system 68 and wafer delivery unit 35 is LW1.

Figure 10B:
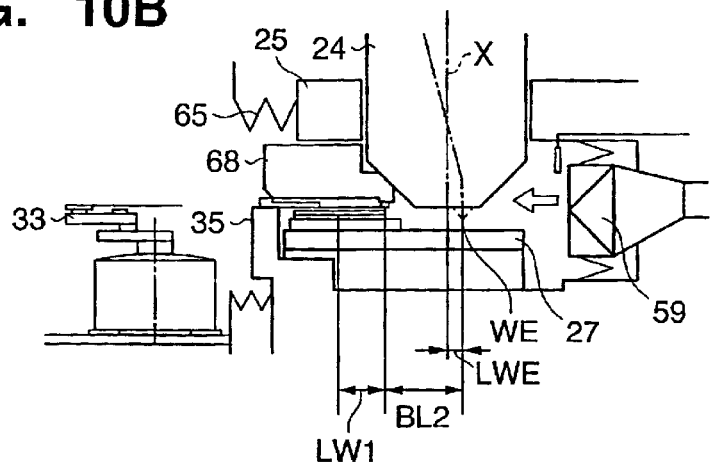
FIG. 10B is a diagram showing a wafer area to which the present invention is not applied.

By contrast, in FIG. 10B, to which the present invention is not applied, the wafer delivery unit 35 and detection system 68 are placed on the side of the optical axis X that is opposite the projection region WE. The distance between the detection system 68 and wafer delivery unit 35 is LW1, the same as in FIG. 10. However, the distance between the detection system 68 and projection region WE is BL3, which is longer than BL1 by twice the length of LWE, namely, the amount of off-centering of the projection region WE. This leads to an increase in the length of the baseline and invites a decline in alignment precision.

Figure 10C:
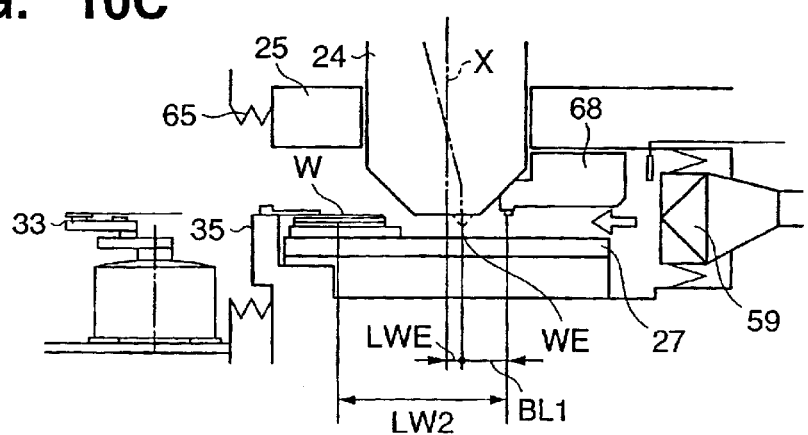
FIG. 10C is a diagram showing a wafer area to which the present invention is not applied.

In FIG. 10C, to which the present invention is not applied, the detection system 68 is placed on the side of the projection region WE and the wafer transport system 33 and wafer delivery unit 35 are placed on the side of the optical axis X that is opposite the projection region WE in order to avoid increasing the length of the baseline, which is the problem encountered in the arrangement in FIG. 10B. With the arrangement in FIG. 10C, the baseline will have a length that is the distance BL1, the same as in the arrangement in FIG. 10A. Further, since the detection system 68 and wafer delivery unit 35 are disposed on opposite sides of the optical axis X, the distance between the detection system 68 and the wafer delivery unit 35 is LW2.

If the arrangements of FIGS. 10A and 10C are compared, it will be understood that LW2 is much larger in length than LW1. As a consequence, the distance between the detection system 68 and the wafer delivery unit 35 is lengthened.

The wafer W that has been transported to the wafer stage 27 by the wafer delivery unit 35 is moved to the observation position of the detection system 68 in order to have its position detected. The lengthening of the distance between the detection system 68 and the wafer delivery unit 35 lengthens the travelling distance to the observation position of the detection system 68 and, therefore, prolongs the travelling time. As a consequence, the throughput of the exposure apparatus declines and so does productivity.

More specifically, by adopting the arrangement shown in FIG. 10A, it becomes possible to arrange it so that the distance between the detection system 68 and the wafer delivery unit 35 is shortened and so is the traveling time to the observation position of the detection system 68. As a result, the throughput and productivity of the exposure apparatus are improved.

With reference again to FIG. 6, the disposition of elements defined by the present invention is applied to both the reticle and wafer areas in the present embodiment. As a result, the space in the chamber can be used efficiently and the apparatus can be reduced in size.

It should be noted that although the present invention is applied to the disposition of both the reticle and wafer areas in this embodiment, this does not impose a limitation upon the invention. For example, even if the reticle illumination region and pattern projection region are not off-centered to the same side, as when the projection optical system 24 is of the reflection type, it is possible to reduce the size of the apparatus by applying the disposition defined by the invention solely to the disposition of the wafer area. That is, there is no limitation to the effect that the present invention be applied simultaneously to both the wafer and reticle areas; the disposition defined by the invention may be applied to either the wafer area or the reticle area separately.

In the embodiment illustrated in FIG. 6, the reticle and wafer areas are disposed laterally in the plane of the drawing. However, it is possible for these areas to be disposed in a direction perpendicular to the plane of the drawing. In this case, also, the detection system and transport system would be disposed on the side on which the illumination region and projection region are present in a manner similar to the above embodiment, thereby making it possible to reduce the size of the apparatus.

Furthermore, as shown in the embodiment of FIG. 6, space within the chamber can be used efficiently by disposing the reticle and wafer areas one above the other, making it possible to reduce the size of the apparatus.

In this embodiment, an example in which the present invention is applied to a scanning-type exposure apparatus has been illustrated. However, the invention is not limited to application to a scanning-type exposure apparatus and the same effects can be obtained even if the invention is applied to a sequential-exposure-type exposure apparatus. Further, similar results can be obtained even if the invention is applied to an EUV exposure apparatus in which light having a wavelength of 5 to 15 nm in the soft X-ray region is used as the exposing light. For example, in an EUV exposure apparatus disclosed in the specification of Japanese Patent Application Laid-Open No. 11-219900, the projection optical system is of the reflection type. As a consequence, the reflection projection optical system has a lens barrel of large diameter and an increase in the size of the apparatus is unavoidable. If the present invention is applied to such an apparatus, the invention will be very effective in reducing the size of the apparatus.

<Third Embodiment>

In a third embodiment, a semiconductor-device manufacturing system that employs the exposure apparatus set forth in the first and second embodiments will be described.

[Embodiment of Semiconductor Production System]

Described next will be an example of a system for producing semiconductor devices eg., (semiconductor chips such as IC and LSI chips, liquid crystal panels, CCDs, thin-film magnetic heads and micromachines, etc.) utilizing the exposure apparatus described above. This system utilizes a computer network outside the semiconductor manufacturing plant to provide troubleshooting and regular maintenance of manufacturing equipment installed at the manufacturing plant and to furnish maintenance service such as the provision of software.

Figure 11:
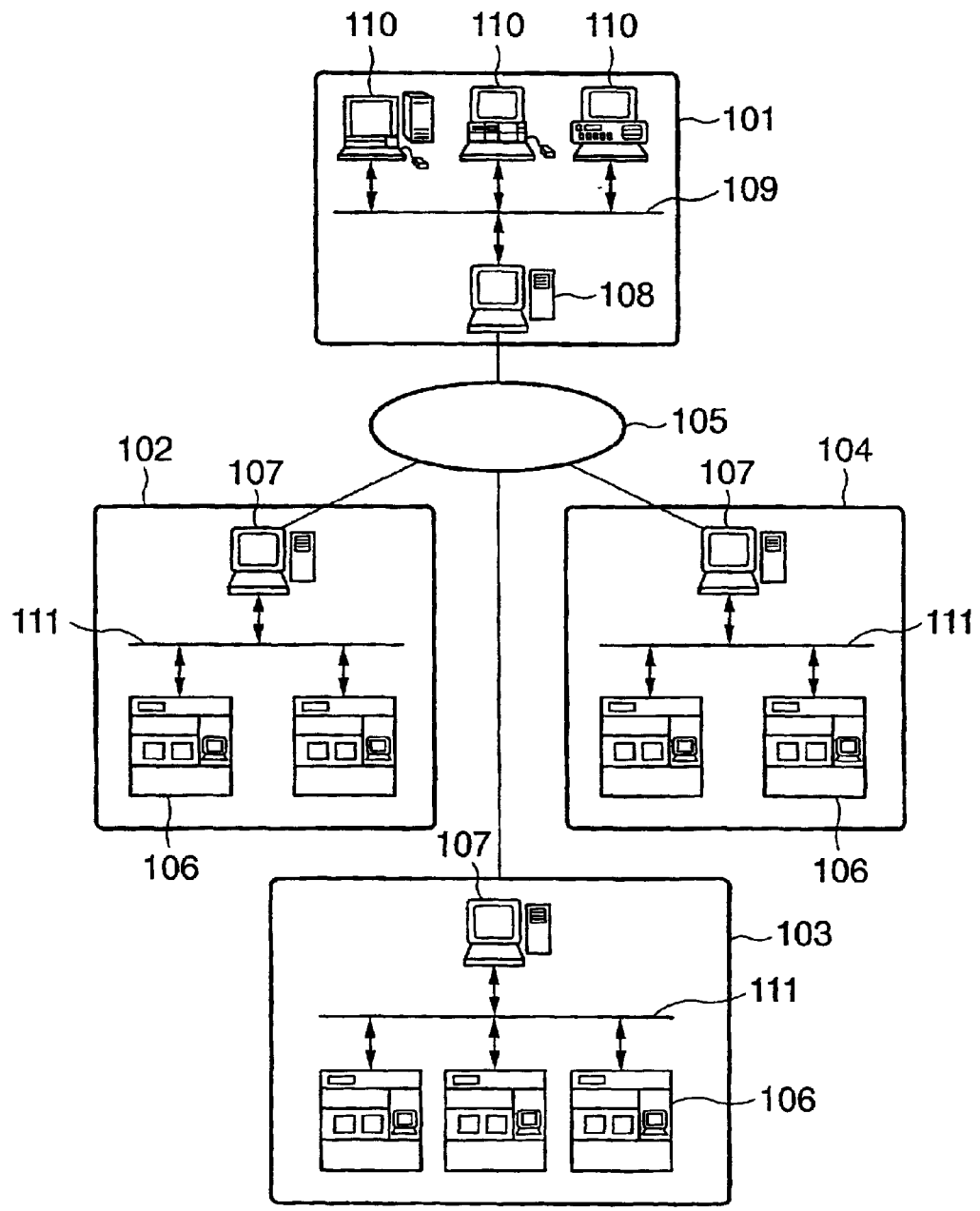
FIG. 11 is a diagram illustrating a system for manufacturing semiconductor devices using an apparatus according to the present invention as seen from a certain viewpoint.

FIG. 11 illustrates the overall system as seen from a certain angle. The system includes the business office 101 of the vendor (equipment supplier) that provides the equipment for manufacturing semiconductor devices. Semiconductor manufacturing equipment for performing various processes used in a semiconductor manufacturing plant is assumed to be the manufacturing equipment. Examples of the equipment are pre-treatment equipment eg., (lithographic equipment such as exposure equipment, resist treatment equipment and etching equipment, heat treatment equipment, thin-film equipment and smoothing equipment, etc.) and post-treatment equipment eg., (assembly equipment and inspection equipment, etc.). The business office 101 includes a host management system 108 for providing a manufacturing-equipment maintenance database, a plurality of control terminal computers 110, and a local-area network (LAN) 109 for connecting these components into an intranet. The host management system 108 has a gateway for connecting the LAN 109 to the Internet 105, which is a network external to the business office 101, and a security function for limiting access from the outside.

Numerals 102 to 104 denote manufacturing plants of semiconductor makers, which are the users of the manufacturing equipment. The manufacturing plants 102 to 104 may be plants belonging to makers that differ from one another or plants belonging to the same maker (e.g., pre-treatment plants and post-treatment plants, etc.). Each of the plants 102 to 104 is provided with a plurality of pieces of manufacturing equipment 106, a local-area network (LAN) 111, which connects these pieces of equipment to construct an intranet, and a host management system 107 serving as a monitoring unit for monitoring the status of operation of each piece of manufacturing equipment 106. The host management system 107 provided at each of the plants 102 to 104 has a gateway for connecting the LAN 111 in each plant to the Internet 105 serving as the external network of the plants. As a result, it is possible for the LAN of each plant to access the host management system 108 on the side of the vendor 101 via the Internet 105. By virtue of the security function of the host management system 108, users allowed to access the host management system 108 are limited. More specifically, status information (e.g., the condition of manufacturing equipment that has malfunctioned), which indicates the status of operation of each piece of manufacturing equipment 106, can be reported from the plant side to the vendor side. In addition, information in response to such notification (e.g., information specifying how to troubleshoot the problem, troubleshooting software and data, etc.), as well as the latest software and maintenance information such as help information, can be acquired from the vendor side. A communication protocol (TCP/IP), which is used generally over the Internet, is employed for data communication between the plants 102~104 and the vendor 101 and for data communication over the LAN 111 within each plant. Instead of utilizing the Internet as the external network of a plant, it is also possible to utilize a highly secure leased-line network (ISDN, etc.) that cannot be accessed by a third party. Further, the host management system is not limited to that provided by a vendor, for an arrangement may be adopted in which the user constructs a database, places it on an external network and allows the database to be accessed from a number of plants that belong to the user.

Figure 12:
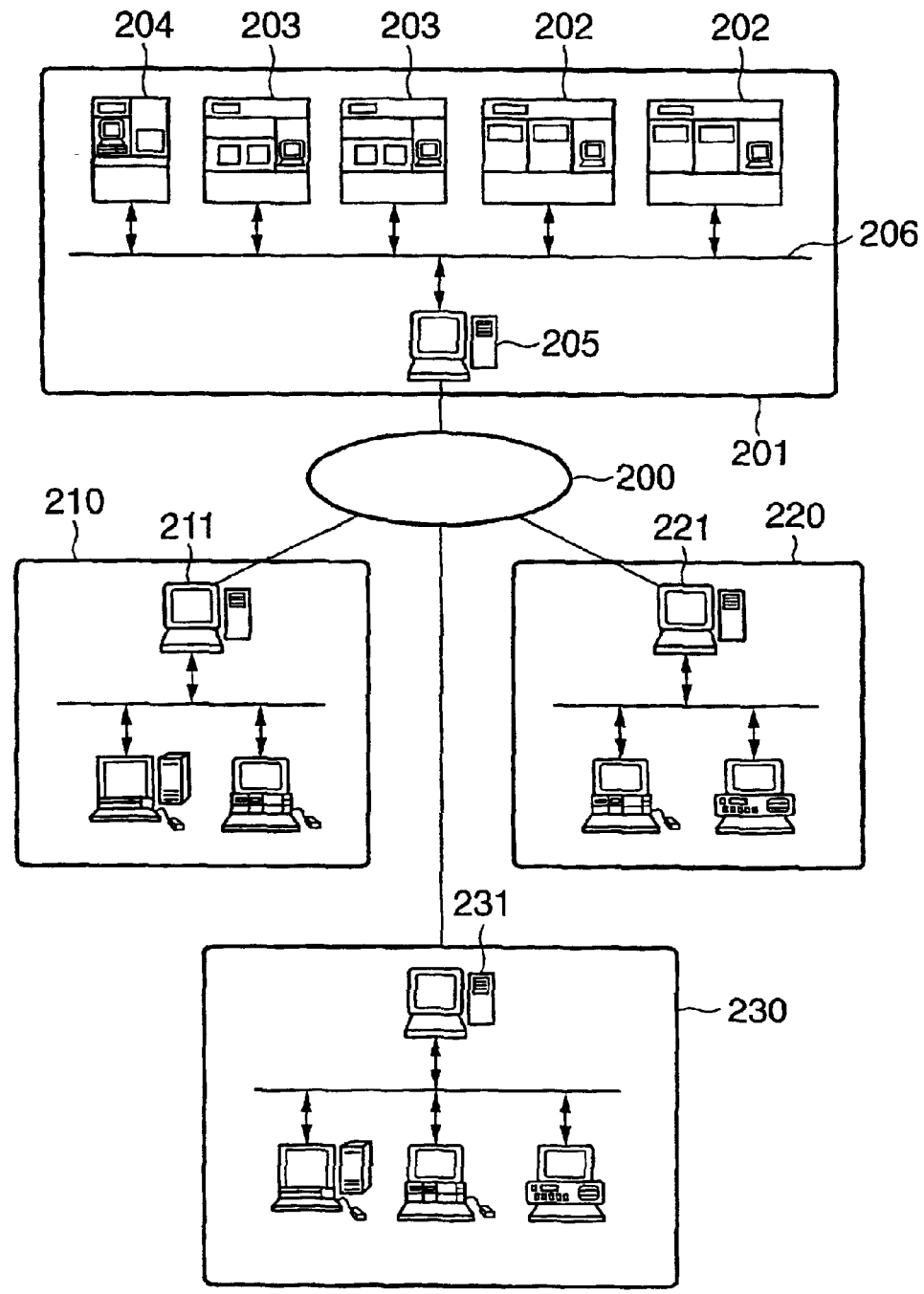
FIG. 12 is a diagram illustrating a system for manufacturing semiconductor devices using an apparatus according to the present invention as seen from a another viewpoint.

FIG. 12 is a conceptual view illustrating the overall system of this embodiment as seen from an angle different from that depicted in FIG. 11. In the earlier example, a plurality of user plants each having manufacturing equipment are connected by an external network to the management system of the vendor that provided the manufacturing equipment, and information concerning the production management of each plant and information concerning at least one piece of manufacturing equipment is communicated by data communication via the external network. In the example of FIG. 12, on the other hand, a plant having manufacturing equipment provided by a plurality of vendors is connected by an outside network to management systems of respective ones of the vendors of these plurality of pieces of manufacturing equipment, and maintenance information for each piece of manufacturing equipment is communicated by data communication. As shown in the drawing, the system includes a manufacturing plant 201 of the user of manufacturing equipment (e.g., the maker of semiconductor devices). The manufacturing line of this plant includes manufacturing equipment for implementing a variety of processes. Examples of such equipment are exposure equipment 202, resist treatment equipment 203 and thin-film treatment equipment 204. Though only one manufacturing plant 201 is shown in FIG. 12, in actuality, a plurality of these plants are networked in the same manner. The pieces of equipment in the plant are interconnected by a LAN 206 to construct an intranet and the operation of the manufacturing line is managed by a host management system 205.

The business offices of vendors (equipment suppliers) such as an exposure equipment maker 210, resist treatment equipment maker 220 and thin-film treatment equipment maker 230 have host management systems 211, 221, 231, respectively, for remote maintenance of the equipment they have supplied. These have maintenance databases and gateways to the outside network, as described earlier. The host management system 205 for managing each piece of equipment in the manufacturing plant of the user is connected to the management systems 211, 221, 231 of the vendors of these pieces of equipment by the Internet or leased-line network serving as an external network 200. If any of the series of equipment in the manufacturing line malfunctions, the line ceases operating. However, this can be dealt with rapidly by receiving remote maintenance from the vendor of the faulty equipment via the Internet 200, thereby making it possible to minimize line downtime.

Each piece of manufacturing equipment installed in the semiconductor manufacturing plant has a display, a network interface and a computer for executing network-access software and equipment operating software stored in a storage device. The storage device can be an internal memory or hard disk or a network file server. The software for network access includes a special-purpose or general-purpose Web browser and presents a user interface, which has a screen of the kind shown by way of example in FIG. 13, on the display. The operator managing the manufacturing equipment at each plant enters information at the input items on the screen while observing the screen. The information includes model 401 of the manufacturing equipment, its serial number 402, subject matter 403 of the problem, its date of occurrence 404, degree of urgency 405, the particular condition 406, countermeasure method 407 and progress report 408. The entered information is transmitted to the maintenance database via the Internet. The resulting appropriate maintenance information is sent back from the maintenance database and is presented on the display screen. The user interface provided by the Web browser implements hyperlink functions 410 to 412 as illustrated and enables the operator to access more detailed information for each item, to extract the latest version of software, which is used for the manufacturing equipment, from a software library provided by the vender, and to acquire an operating guide (help information) for reference by the plant operator. Here, the maintenance information provided by the maintenance database also includes the above-described information relating to the present invention, and the software library also provides the latest software for implementing the present invention.

(Process for Manufacturing Semiconductor Device)

Figure 14:
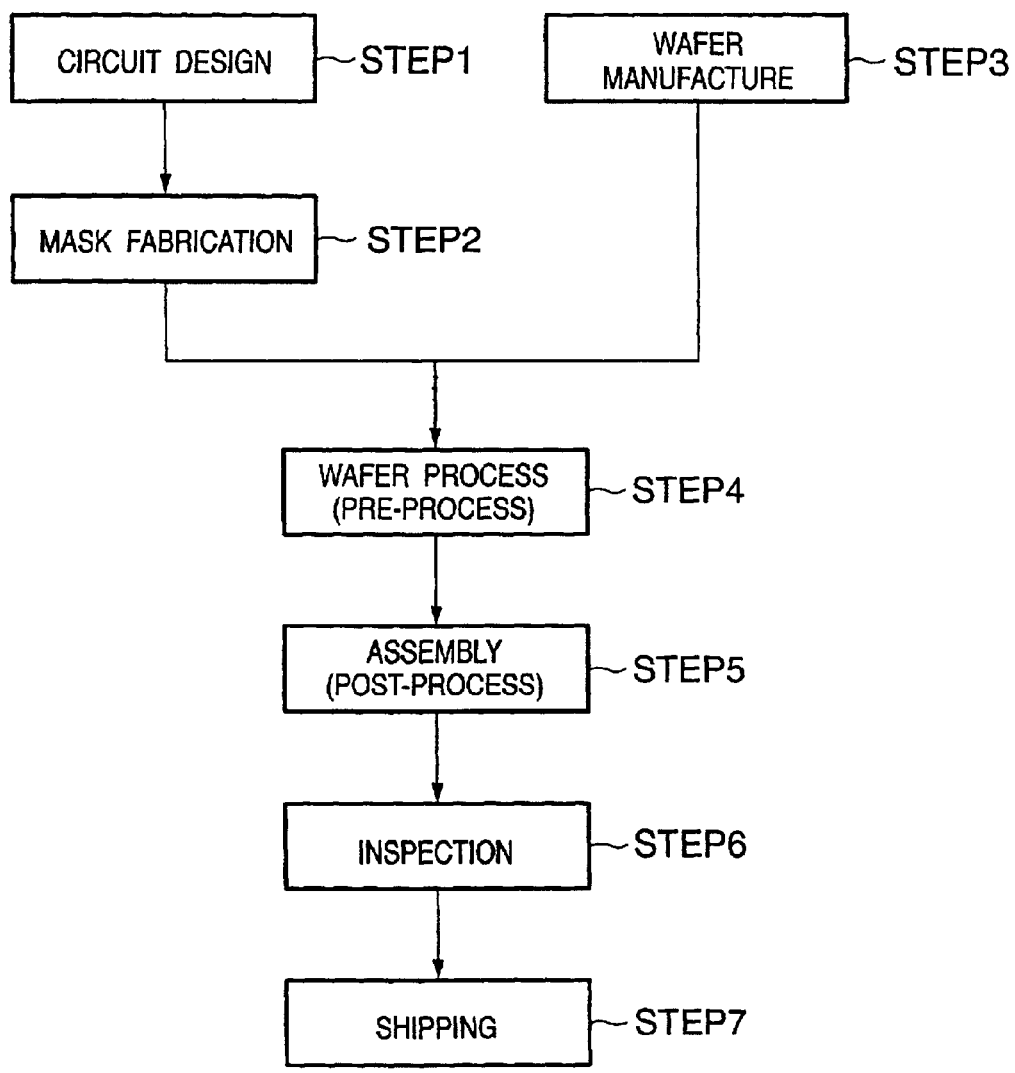
FIG. 14 is a diagram useful in describing the flow of a process for manufacturing semiconductor devices.

A process for manufacturing a semiconductor device utilizing the production system set forth above will now be described. FIG. 14 illustrates the overall flow of a process for manufacturing semiconductor devices. The circuit for the device is designed at step 1 (circuit design). A mask on which the designed circuit pattern has been formed is fabricated at step 2 (mask fabrication). Meanwhile, a wafer is manufactured using a material such as silicon or glass at step 3 (wafer manufacture). The actual circuit is formed on the wafer by lithography, using the mask and wafer that have been prepared, at step 4 (wafer process), which is also referred to as "pre-treatment". A semiconductor chip is obtained, using the wafer fabricated at step 4, at step 5 (assembly), which is also referred to as "post-treatment". This step includes steps such as actual assembly (dicing and bonding) and packaging (chip encapsulation). The semiconductor device fabricated at step 5 is subjected to inspections such as an operation verification test and durability test at step 6 (inspection). The semiconductor device is completed through these steps and then is shipped (step 7). The pre- and post-treatments are performed at separate special-purpose plants. Maintenance is carried out on a per-plant basis by the above-described remote maintenance system. Further, information for production management and equipment maintenance is communicated by data communication between the pre- and post-treatment plants via the Internet or leased-line network.

Figure 15:
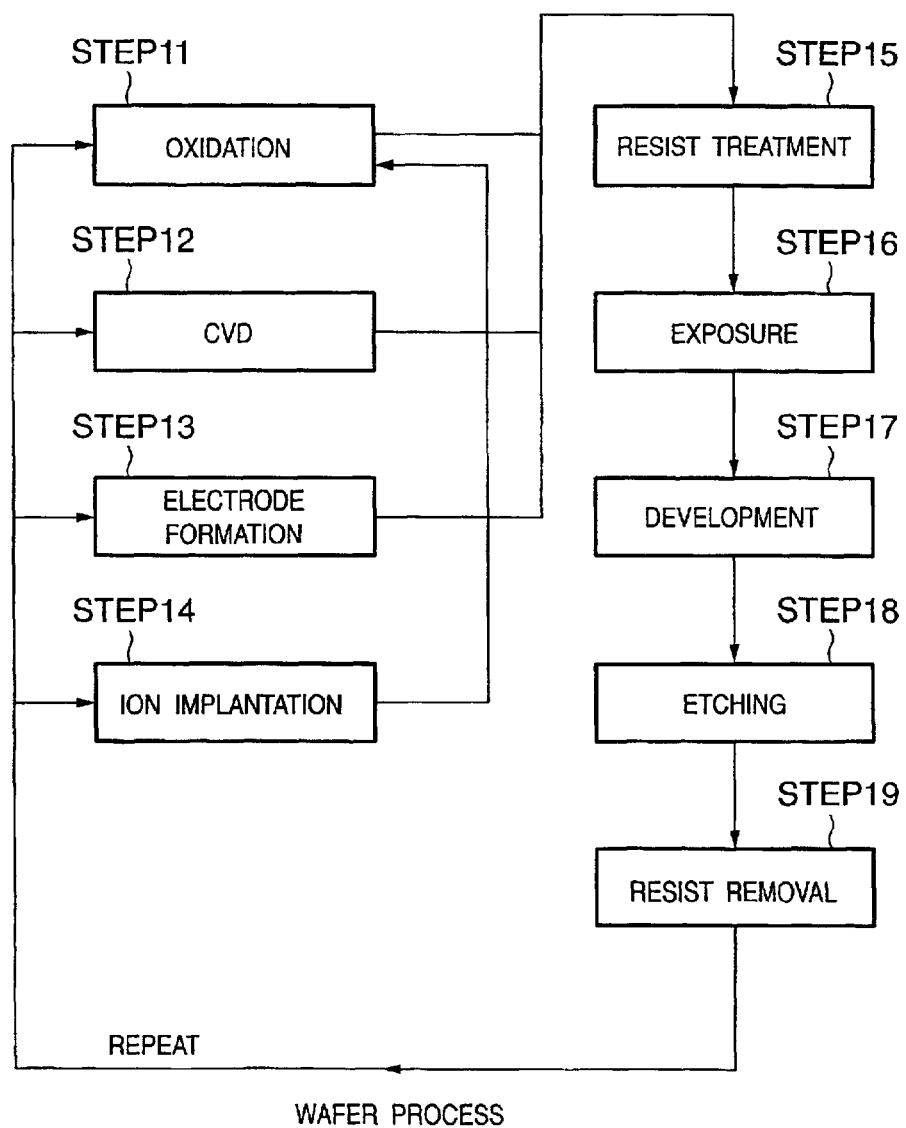
FIG. 15 is a diagram useful in describing a wafer process.

FIG. 15 is a flowchart illustrating the detailed flow of the wafer process mentioned above. The surface of the wafer is oxidized at step 11 (oxidation). An insulating film is formed on the wafer surface at step 12 (CVD), electrodes are formed on the wafer by vapor deposition at step 13 (electrode formation), and ions are implanted in the wafer at step 14 (ion implantation). The wafer is coated with a photoresist at step 15 (resist treatment), the wafer is exposed to the circuit pattern of the mask to print the pattern onto the wafer by the above-described exposure apparatus at step 16 (exposure), and the exposed wafer is developed at step 17 (development). Portions other than the developed photoresist are etched away at step 18 (etching), and unnecessary resist left after etching is performed is removed at step 19 (resist removal). Multiple circuit patterns are formed on the wafer by implementing these steps repeatedly. Since the manufacturing equipment used at each step is maintained by the remote maintenance system described above, malfunctions can be prevented and quick recovery is possible if a malfunction should happen to occur. As a result, the productivity of the semiconductor device manufacture can be improved over the prior art.

Thus, in accordance with the present invention, as described above, the effects of measurement error due to baseline fluctuation can be mitigated and the position of an object to be detected (a position detection mark) can be detected highly precisely so that highly accurate alignment can be achieved.

Further, in accordance with the present invention, the baseline length can be shortened while using a reflectionrefraction-type projection optical system. As a result, resolution can be raised by reducing the wavelength of exposing light and alignment precision can be improved by shortening the baseline. Furthermore, the apparatus can be reduced in size and it is possible to lower the initial and running costs of the production facilities. Further, in accordance with the present invention, it is possible to provide an exposure apparatus having improved throughput and high productivity.

As many apparently widely different embodiments of the present invention can be made without departing from the spirit and scope thereof, it is to be understood that the invention is not limited to the specific embodiments thereof except as defined in the appended claims.

What is claimed is:

1. An exposure apparatus comprising:
   an illumination optical system for illuminating a reticle with illuminating light from a light source;
   a projection optical system for projecting a pattern, which has been formed on the reticle, onto a photosensitive substrate;
   a holding unit for holding the reticle;
   a reticle transport system for transporting the reticle;
   a substrate stage capable of holding and moving the substrate; and
   a substrate transport system for transporting the substrate,
   wherein at least one of a pair of said reticle transport system and said holding unit and a pair of said substrate transport system and said substrate stage is accommodated in a partitioned circulation space in which inert gas is filled and the inert gas is circulated by a circulating system having a temperature control mechanism, and the partitioned circulation space includes a connecting member which is airtight and flexible.

2. The apparatus according to claim 1, further including an air conditioning system which circulates temperature controlled gas in a space other than the partitioned circulation space.

3. The apparatus according to claim 1, further comprising a position detection system for detecting an alignment mark on the substrate,
   wherein a pattern projection region for projecting the pattern onto the substrate by said projection optical system is formed at a position that is off-centered toward the side of said position detection system from the projection center of said projection optical system.

4. The apparatus according to claim 3, wherein said substrate transport system is disposed on the side of the projection region with respect to the projection center.

5. The apparatus according to claim 4, wherein said apparatus has a plurality of said position detection systems, and said plurality of position detections systems are disposed on the side of said projection region with respect to the projection center.

6. The apparatus according to claim 1, wherein a projection region of the pattern, which region is formed on the substrate via said projection optical system, is formed at a position that is off-centered with respect to the projection center of said projection optical system, and said mask transport system is disposed on the side of the illumination region with respect to the projection center.

7. The apparatus according to claim 1, wherein a projection region of the pattern, which region is formed on the substrate via said projection optical system, and an illumination region on the mask, are formed at positions that are off-centered to the same side with respect to the projection center of said projection optical system, and said mask transport system and said substrate transport system are disposed on the side of the projection region and an illuminating region with respect to the projection center.

* * * * *

UNITED STATES PATENT AND TRADEMARK OFFICE
CERTIFICATE OF CORRECTION

PATENT NO.     : 6,822,727 B2
DATED          : November 23, 2004
INVENTOR(S)    : Shinichi Shima It is certified that error appears in the above-identified patent and that said Letters Patent is hereby corrected as shown below:

Title page,
Item [57], ABSTRACT, delete the current abstract and insert the following therefor:

-- An exposure apparatus includes an illumination optical system for illuminating a reticle with illuminating light from a light source, a projection optical system for projecting a pattern, which has been formed on the reticle, onto a photosensitive substrate, a holding unit for holding the reticle, a reticle transport system for transporting the reticle, a substrate stage capable of holding and moving the substrate, and a substrate transport system for transporting the substrate. Further, at least one of a pair of the reticle transport system and the holding unit and a pair of the substrate transport system and the substrate stage is accommodated in a partitioned circulation space in which inert gas is filled and the inert gas is circulated by a circulating system having a temperature control mechanism. --

Column 1,
Line 47, "also demand" should read -- also a demand --.
Line 48, "especially" should read -- especially, --.
Line 49, "of" should read -- having a -- and "wavelength 157.6 nm." should read -- wavelength of 157.6 nm.
Line 60, "of" should read -- having a -- and "wavelength 200 nm" should read -- wavelength of 200 nm --
Line 61, "of oscillation" should read -- of the oscillation --.
Line 63, "project" should read -- to project --.

Column 2,
Line 4, "aberration" should read -- aberrations --.
Line 16, "quality" should read -- quantity --.
Line 21, "position" should read -- positions --.
Line 29, "reflection-refraction-type" should read -- a reflection-refraction-type --.
Line 31, "of refraction" should read -- of a refraction --.
Line 32, "telecentrically" should read -- telecentrically, --.
Line 61, "improvement alignment" should read -- improvement in alignment --.

Column 3,
Line 10, "(Though" should read -- (Through --.
Line 14, "of line" should read -- of a line --.
Line 22, "is small" should read -- is a small --.
Line 23, "made short-" should read -- made to be short- --.
Line 29, ""Off-axis" should read -- an "Off-axis --.
Line 37, "from resist" should read -- from a resist --.
Line 42, "where" should read -- wherein --.

UNITED STATES PATENT AND TRADEMARK OFFICE
CERTIFICATE OF CORRECTION

PATENT NO. : 6,822,727 B2
DATED : November 23, 2004
INVENTOR(S) : Shinichi Shima It is certified that error appears in the above-identified patent and that said Letters Patent is hereby corrected as shown below:

Column 4,
Line 56, "(*X5-BL-XP*) or (*X5-BL+XP*)" should read -- (*XS-BL-XP*) or (*X5-BL+XP*). --.
Line 63, "accurate" should read -- accurately --.
Line 66, "actuality" should read -- actuality, --.

Column 6,
Line 11, "distance" should read -- the distance --.
Line 27, "or ArF" should read -- or an ArF --.
Line 34, "where" should read -- wherein --.
Line 47, "prior-art" should read -- prior art --.

Column 7,
Line 27, "where" should read -- wherein --.

Column 8,
Line 29, "for various" should read -- for performing various --.

Column 10,
Line 47, "details the" should read -- details of the --.
Line 60, "wavelength 157.6 nm)" should read -- wavelength of 157.6 nm) --.

Column 11,
Line 18, "of measurement." should read -- of the measurement. --.
Line 42, "measurement." should read -- the measurement. --.

Column 12,
Line 12, "where" should read -- wherein --.
Line 17, "to position" should read -- to the position --.
Line 20, "optic" should read -- optical --.
Line 23, "Thus" should read -- Thus, --.
Line 40, "opposite the" should read -- opposite to the --.
Line 57, "in highly" should read -- in a highly --

Column 13,
Line 3, "where" should read -- wherein --.

UNITED STATES PATENT AND TRADEMARK OFFICE
CERTIFICATE OF CORRECTION

PATENT NO. : 6,822,727 B2
DATED : November 23, 2004
INVENTOR(S) : Shinichi Shima It is certified that error appears in the above-identified patent and that said Letters Patent is hereby corrected as shown below:

Column 14,
Line 10, "stage 26" should read -- stage 26, --.
Line 17, "this" should read -- the --.
Line 27, "and lower" should read -- and to lower --.
Line 32, "preferably" should read -- preferably, --.
Line 41, "In case" should read -- In the case --.
Line 55, "and lower" should read -- and to lower --.

Column 15,
Line 58, "where" should read -- wherein --.

Column 16,
Line 62, "spaces 69, 70" should read -- spaces 69, 70, --.

Column 17,
Line 3, "spaces therefore" should read -- spaces, therefore, --.
Line 53, "FIG. 9B." should read -- FIG. 9B, --.
Line 56, "opposite the" should read -- opposite to the --.
Line 62, "namely" should read -- namely, --.

Column 18,
Line 42, "opposite the" should read -- opposite to the --.
Line 52, "that LW2" should read -- that length LW2 --.

Column 19,
Line 33, "space" should read -- the space --.
Line 49, "of large" should read -- of a large --.
Line 59, "of Semiconductor" should read -- of a Semiconductor --.
Line 61, "eg., (semiconductor" should read -- (e.g., semiconductor --.

Column 20,
Line 9, "eg., (lithographic" should read -- (e.g., lithographic --.
Line 12, "etc.)" should read -- etc.), --.
Line 13, "eg., (assembly" should read -- (e.g., assembly --.

Column 21,
Line 15, "manufacturing" should read -- the manufacturing -- and "of semiconductor" should read -- of a semiconductor --.
Line 16, "devices)." should read -- device). --.

UNITED STATES PATENT AND TRADEMARK OFFICE
CERTIFICATE OF CORRECTION

PATENT NO. : 6,822,727 B2
DATED : November 23, 2004
INVENTOR(S) : Shinichi Shima It is certified that error appears in the above-identified patent and that said Letters Patent is hereby corrected as shown below:

Column 21 (cont'd),
Line 27, "maker 210, resist" should read -- maker 210, a resist --.
Line 28, "and thin-film" should read -- and a thin-film --.
Line 30, "for remote" should read -- for performing remote --.

Column 22,
Line 2, "vender," should read -- vendor, --.
Line 9, "Manufacturing Semiconductor" should read -- Manufacturing a Semiconductor --.
Line 27, "and durability" should read -- and a durability --.

Column 24,
Line 15, "detections" should read -- detection --.

Signed and Sealed this

Tenth Day of May, 2005

JON W. DUDAS
*Director of the United States Patent and Trademark Office*